(12) United States Patent
Yamazaki et al.

(10) Patent No.: US 8,945,981 B2
(45) Date of Patent: *Feb. 3, 2015

(54) SEMICONDUCTOR DEVICE AND MANUFACTURING METHOD THEREOF

(75) Inventors: Shunpei Yamazaki, Setagaya (JP); Hidekazu Miyairi, Isehara (JP); Kengo Akimoto, Atsugi (JP); Kojiro Shiraishi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1104 days.

This patent is subject to a terminal disclaimer.

(21) Appl. No.: 12/511,273

(22) Filed: Jul. 29, 2009

(65) Prior Publication Data

US 2010/0025677 A1    Feb. 4, 2010

(30) Foreign Application Priority Data

Jul. 31, 2008  (JP) .................................. 2008-197143

(51) Int. Cl.
    *H01L 21/00*   (2006.01)
    *H01L 29/786*  (2006.01)
    *H01L 27/12*   (2006.01)

(52) U.S. Cl.
    CPC ........ *H01L 29/7869* (2013.01); *H01L 27/1225* (2013.01)
    USPC .................................. 438/104; 257/E29.296

(58) Field of Classification Search
    CPC .................. H01L 29/7869; H01L 29/78693; H01L 27/1225; H01L 21/02414; H01L 21/02403
    USPC .............................. 438/104; 257/43, E29.296
    See application file for complete search history.

(56) References Cited

U.S. PATENT DOCUMENTS

| | | | |
|---|---|---|---|
| 5,313,075 | A | 5/1994 | Zhang et al. |
| 5,468,521 | A | 11/1995 | Kanai et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Stephen W Smoot
*Assistant Examiner* — Sun M Kim
(74) *Attorney, Agent, or Firm* — Eric J. Robinson; Robinson Intellectual Property Law Office, P.C.

(57) ABSTRACT

To provide a semiconductor device including a thin film transistor having excellent electric characteristics and high reliability and a manufacturing method of the semiconductor device with high mass productivity. The summary is that an inverted-staggered (bottom-gate) thin film transistor is included in which an oxide semiconductor film containing In, Ga, and Zn is used as a semiconductor layer, a channel protective layer is provided in a region that overlaps a channel formation region of the semiconductor layer, and a buffer layer is provided between the semiconductor layer and source and drain electrodes. An ohmic contact is formed by intentionally providing the buffer layer having a higher carrier concentration than the semiconductor layer between the semiconductor layer and the source and drain electrodes.

28 Claims, 28 Drawing Sheets

(56) References Cited

U.S. PATENT DOCUMENTS

| | | | |
|---|---|---|---|
| 5,523,240 A | 6/1996 | Zhang et al. | |
| 5,731,856 A | 3/1998 | Kim et al. | |
| 5,744,864 A | 4/1998 | Cillessen et al. | |
| 5,847,410 A | 12/1998 | Nakajima | |
| 5,893,730 A | 4/1999 | Yamazaki et al. | |
| 5,911,857 A * | 6/1999 | Kim | 204/192.15 |
| 6,294,274 B1 | 9/2001 | Kawazoe et al. | |
| 6,563,174 B2 | 5/2003 | Kawasaki et al. | |
| 6,576,061 B1 | 6/2003 | Moriyama et al. | |
| 6,576,534 B1 | 6/2003 | Zhang et al. | |
| 6,586,346 B1 | 7/2003 | Yamazaki et al. | |
| 6,607,947 B1 | 8/2003 | Zhang et al. | |
| 6,727,522 B1 | 4/2004 | Kawasaki et al. | |
| 6,794,682 B2 | 9/2004 | Watanabe et al. | |
| 6,858,308 B2 | 2/2005 | Kondo et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,115,913 B2 | 10/2006 | Shigeno | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,355,202 B2 | 4/2008 | Zhang et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,501,305 B2 | 3/2009 | Takai et al. | |
| 7,601,994 B2 | 10/2009 | Fukuchi et al. | |
| 7,635,889 B2 | 12/2009 | Isa et al. | |
| 7,674,650 B2 | 3/2010 | Akimoto et al. | |
| 7,732,819 B2 | 6/2010 | Akimoto et al. | |
| 7,767,505 B2 * | 8/2010 | Son et al. | 438/158 |
| 7,816,680 B2 | 10/2010 | Kim et al. | |
| 7,883,912 B2 | 2/2011 | Fukuchi et al. | |
| 7,910,920 B2 | 3/2011 | Park et al. | |
| 8,063,421 B2 * | 11/2011 | Kang et al. | 257/290 |
| 8,084,307 B2 | 12/2011 | Itagaki et al. | |
| 8,101,467 B2 | 1/2012 | Yamazaki et al. | |
| 8,143,115 B2 | 3/2012 | Omura et al. | |
| 8,148,721 B2 | 4/2012 | Hayashi et al. | |
| 8,283,666 B2 * | 10/2012 | Kim et al. | 257/57 |
| 8,293,595 B2 * | 10/2012 | Yamazaki et al. | 438/158 |
| 8,324,018 B2 | 12/2012 | Isa et al. | |
| 8,343,817 B2 * | 1/2013 | Miyairi et al. | 438/151 |
| 8,629,069 B2 * | 1/2014 | Akimoto et al. | 438/104 |
| 2001/0011726 A1 | 8/2001 | Hayashi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0177293 A1 * | 11/2002 | Wilk et al. | 438/591 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0020006 A1 | 1/2005 | Zhang et al. | |
| 2005/0199959 A1 | 9/2005 | Chiang et al. | |
| 2005/0221542 A1 | 10/2005 | Yamazaki et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0051952 A1 * | 3/2007 | Yamazaki et al. | 257/59 |
| 2007/0052025 A1 | 3/2007 | Yabuta | |
| 2007/0054507 A1 | 3/2007 | Kaji et al. | |
| 2007/0072439 A1 * | 3/2007 | Akimoto et al. | 438/795 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 * | 10/2008 | Park et al. | 257/43 |
| 2008/0258143 A1 | 10/2008 | Kim et al. | |
| 2008/0283842 A1 | 11/2008 | Hayashi et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0101910 A1 | 4/2009 | Zhang et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0267064 A1 | 10/2009 | Yano et al. | |
| 2009/0278120 A1 | 11/2009 | Lee et al. | |
| 2009/0278122 A1 | 11/2009 | Hosono et al. | |
| 2009/0280600 A1 | 11/2009 | Hosono et al. | |
| 2009/0289258 A1 | 11/2009 | Kim et al. | |
| 2009/0294808 A1 | 12/2009 | Ito | |
| 2010/0025675 A1 | 2/2010 | Yamazaki et al. | |
| 2010/0025676 A1 | 2/2010 | Yamazaki et al. | |
| 2010/0025678 A1 | 2/2010 | Yamazaki et al. | |
| 2010/0025679 A1 | 2/2010 | Yamazaki et al. | |
| 2010/0035379 A1 | 2/2010 | Miyairi et al. | |
| 2010/0051936 A1 | 3/2010 | Hayashi et al. | |
| 2010/0051938 A1 | 3/2010 | Hayashi et al. | |
| 2010/0065837 A1 | 3/2010 | Omura et al. | |
| 2010/0065844 A1 | 3/2010 | Tokunaga | |
| 2010/0092800 A1 | 4/2010 | Itagaki et al. | |

(56) References Cited

U.S. PATENT DOCUMENTS

| | | | |
|---|---|---|---|
| 2010/0109002 | A1 | 5/2010 | Itagaki et al. |
| 2010/0155717 | A1 | 6/2010 | Yano et al. |
| 2010/0171120 | A1 | 7/2010 | Gosain et al. |
| 2011/0065216 | A1 | 3/2011 | Kaji et al. |
| 2011/0115763 | A1 | 5/2011 | Yamazaki et al. |
| 2011/0186850 | A1 | 8/2011 | Yamazaki et al. |
| 2012/0168750 | A1 | 7/2012 | Hayashi et al. |
| 2012/0273779 | A1 | 11/2012 | Yamazaki et al. |
| 2012/0318447 | A1 | 12/2012 | Ozawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-091467 A | 4/1989 |
| JP | 03-231472 | 10/1991 |
| JP | 05-251705 A | 9/1993 |
| JP | 08-264794 A | 10/1996 |
| JP | 09-082681 A | 3/1997 |
| JP | 11 505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368229 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073976 A | 3/2007 |
| JP | 2007-096055 | 4/2007 |
| JP | 2007-123861 | 5/2007 |
| JP | 2007-250983 | 9/2007 |
| JP | 2007-258223 A | 10/2007 |
| JP | 2007-298627 A | 11/2007 |
| JP | 2008-060419 A | 3/2008 |
| JP | 2008-130814 A | 6/2008 |
| JP | 2008-166716 A | 7/2008 |
| JP | 2008-219008 A | 9/2008 |
| JP | 2008-243928 A | 10/2008 |
| JP | 2010-080936 | 4/2010 |
| KR | 2006-0134939 A | 12/2006 |
| KR | 2008-0016234 A | 2/2008 |
| WO | WO-2004/114391 | 12/2004 |
| WO | WO-2005/041311 | 5/2005 |
| WO | WO 2007/119386 | 10/2007 |
| WO | WO-2008/062720 | 5/2008 |
| WO | WO-2008/069056 | 6/2008 |
| WO | WO-2008/069255 | 6/2008 |

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Park.J et al., "High performance amorphous oxide thin film transistors with self-aligned top-gate structure,", IEDM 09: Technical Digest of International Electron Devices Meeting, Dec. 7, 2009, pp. 191-194.

Nakamura. M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Dembo.H et al., "RFCPUS on Glass and Plastic Substrates Fabricated by TFT Transfer Technology,", IEDM '05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ ,(m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Osada.T et al., "15.2: Development of Driver-Integrated Panel using Amorphous In—Ga—Oxide TFT,", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, pp. 899-902.

Kanno.H et al., "White Stacked Electrophosphorecent Organic Light-Emitting Device Employing $MoO_3$ as a Change-Generation Layer,", Adv. Mater. (Avanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguished Paper 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by Peald Grown ZnO TFT,", IMID '07 Digest, 2007, p. 1249-1252.

Godo.H et al., "Temperature Dependence of Characteristics and Electronic Structure For Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "58.2 Invited Paper : SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Ide et al., Effects of Excess Oxygen on Operation Characteristics of Amorphous In—Ga—Zn—O Thin-Film Transistors, Applied Physics Letters, 2011, vol. 99, pp. 093507-1-093507-3.

Notice of Allowability (U.S. Appl. No. 12/535,713) dated Jul. 16, 2012, pp. 2-3.

Allowed Claims (U.S. Appl. No. 12/535,713), 2012.

\* cited by examiner

FIG. 3A1
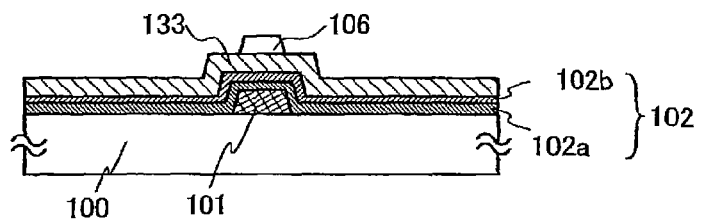
FIG. 3A2
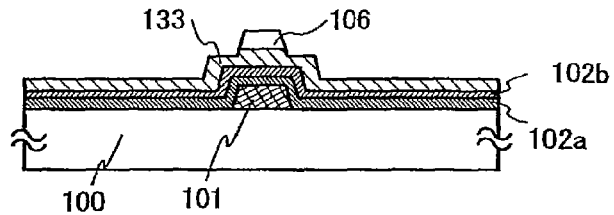
FIG. 3B
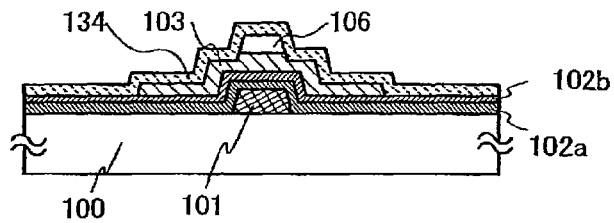
FIG. 3C
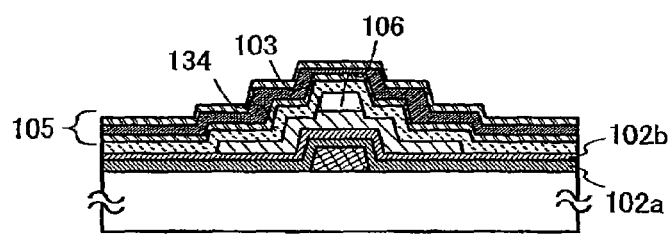
FIG. 3D
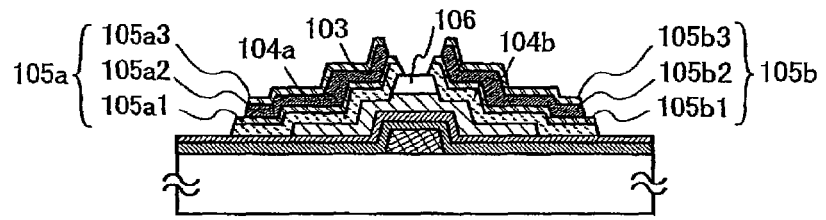

SEMICONDUCTOR DEVICE AND MANUFACTURING METHOD THEREOF

BACKGROUND OF THE INVENTION

1. Field of the Invention

An embodiment of the present invention relates to a semiconductor device which has a circuit including a thin film transistor (hereinafter, referred to as a TFT) in which a channel formation region is formed using an oxide semiconductor film and a manufacturing method thereof. For example, an embodiment of the present invention relates to an electronic appliance in which an electro-optical device typified by a liquid crystal display panel or a light-emitting display device including an organic light-emitting element is mounted as its component.

Note that the semiconductor device in this specification indicates all the devices which can operate by using semiconductor characteristics, and an electro-optical device, a semiconductor circuit, and an electronic appliance are all included in the semiconductor devices.

2. Description of the Related Art

In recent years, active-matrix display devices (such as liquid crystal display devices, light-emitting display devices, or electrophoretic display devices) in which a switching element of a thin film transistor (TFT) is provided for each of display pixels arranged in matrix have been actively developed. In the active-matrix display devices, a switching element is provided for each of pixels (or each of dots), and thus, there is such an advantage that the active matrix display devices can be driven at lower voltage than passive matrix display devices in the case where the pixel density is increased.

In addition, a technique has attracted attention, where a thin film transistor (TFT) in which a channel formation region is formed using an oxide semiconductor film, or the like is manufactured and such a TFT or the like is applied to electronic devices or optical devices. For example, a TFT in which ZnO is used for an oxide semiconductor film or a TFT in which $InGaO_3(ZnO)_m$ is used for an oxide semiconductor film can be given. A technique in which a TFT including such an oxide semiconductor film is formed over a light-transmitting substrate and used as a switching element or the like of an image display device, is disclosed in Reference 1 and Reference 2.

REFERENCES

Patent Document

[Patent Document 1] Japanese Published Patent Application No. 2007-123861
[Patent Document 2] Japanese Published Patent Application No. 2007-96055

SUMMARY OF THE INVENTION

A thin film transistor using an oxide semiconductor film for a channel formation region is required to operate at high speed, be manufactured through a relatively simple process, and be sufficiently reliable.

In forming a thin film transistor, a metal material having low resistance is used for source and drain electrodes. In particular, in the case of manufacturing display devices performing large-area display, the problem of signal delay due to wiring resistance becomes significant. Therefore, a metal material having low electric resistance is desirably used as a material of a wiring or an electrode. On the other hand, in the case of the thin film transistor structure in which an oxide semiconductor film is directly in contact with source and drain electrodes formed using a metal material having low electric resistance, contact resistance might be high. As one of factors causing high contact resistance, the following condition is given: Schottky junction is formed at the interface between the oxide semiconductor film and the source and drain electrodes.

In addition, capacitance is caused in a portion where the oxide semiconductor film and the source and drain electrodes are directly in contact with each other, and frequency characteristics (referred to as f characteristics) are low, which might hinder high-speed operation of the thin film transistor.

An object of an embodiment of the present invention is to provide a thin film transistor using an oxide semiconductor film containing indium, gallium, and zinc, in which contact resistance between an oxide semiconductor layer and source and drain electrodes is reduced, and a method for manufacturing the thin film transistor.

Another object is to improve operation characteristics and reliability of a thin film transistor using an oxide semiconductor film containing indium, gallium, and zinc.

Another object is to reduce variations in electric characteristics of thin film transistors each using an oxide semiconductor film containing indium, gallium, and zinc. In particular, in a liquid crystal display device, in the case where there are large variations between elements, display unevenness due to variations in TFT characteristics might be caused.

Also in a display device having a light-emitting element, in the case where variations in ON current ($I_{on}$) of TFTs (TFTs in a driver circuit or TFTs provided in a pixel and supplying a current to a light-emitting element) arranged so that a certain current flows to pixel electrodes are large, luminance of a display screen might be varied.

As described above, an object of an embodiment of the present invention is to achieve at least one of the above objects.

The summary of an embodiment of the present invention is that an inverted-staggered (bottom-gate) thin film transistor is included in which an oxide semiconductor containing indium, gallium, and zinc is used as a semiconductor layer and a buffer layer is provided between the semiconductor layer and source and drain electrodes.

In this specification, a semiconductor layer formed using an oxide semiconductor film containing indium, gallium, and zinc is also referred to as an "IGZO semiconductor layer".

An ohmic contact of an IGZO semiconductor layer and a source electrode is necessary and the contact resistance therebetween is desirably as low as possible. Similarly, an ohmic contact of the IGZO semiconductor layer and a drain electrode is necessary and the contact resistance therebetween is desirably as low as possible.

Therefore, an ohmic contact is formed by intentionally providing a buffer layer having a higher carrier concentration than the IGZO semiconductor layer between the IGZO semiconductor layer and the source electrode.

For the buffer layer, metal oxide having n-type conductivity is used. As the metal oxide, titanium oxide, molybdenum oxide, zinc oxide, indium oxide, tungsten oxide, magnesium oxide, calcium oxide, tin oxide, or the like can be used for example. The buffer layer may contain an impurity imparting n-type or p-type conductivity. As the impurity, indium, gallium, aluminum, zinc, tin, or the like can be used.

Since the buffer layer has a higher carrier concentration than the IGZO semiconductor layer and is superior in conductivity, the contact resistance can be reduced as compared to the case of directly attaching the source and drain electrodes to the semiconductor layer.

The buffer layer functions as an n⁺ layer and can also be referred to as a drain region or a source region.

An embodiment of a semiconductor device of the present invention includes a gate electrode; a gate insulating film over the gate electrode; an oxide semiconductor layer over the gate insulating film; a channel protective layer over the oxide semiconductor layer, in which the channel protective layer overlaps a channel formation region of the oxide semiconductor layer; a first buffer layer and a second buffer layer over the oxide semiconductor layer; and a source electrode over the first buffer layer, and a drain electrode over the second buffer layer, in which the first buffer layer and the second buffer layer include titanium oxide, and in which a portion of the first buffer layer and a portion of the second buffer layer are in contact with an upper surface of the channel protective layer.

Further, a second buffer layer having a carrier concentration higher than that of the semiconductor layer and lower than that of the buffer layer may be provided between the semiconductor layer and the buffer layer. The second buffer layer functions as an n⁻ layer.

That is, an embodiment of the semiconductor device of the present invention includes a thin film transistor which includes a gate electrode, a gate insulating film which covers the gate electrode, an IGZO semiconductor layer formed over the gate insulating film, a channel protective layer formed in a region that overlaps a channel formation region of the IGZO semiconductor layer, a two-layer buffer layer formed over the semiconductor layer, and source and drain electrodes formed over the two-layer buffer layer. The buffer layer includes metal oxide having n-type conductivity, and the semiconductor layer and the source and drain electrodes are electrically connected to each other through the buffer layer. The buffer layer which is in contact with the IGZO semiconductor layer functions as an n⁻ layer.

In the above-described structure, it is preferable that the buffer layer contain titanium. Further, the source and drain electrodes preferably contain titanium. For example, a multilayer film of a titanium film, an aluminum film, and a titanium film has low resistance and hillocks are unlikely to be generated in the aluminum film.

The thin film transistor according to an embodiment of the present invention is provided with a channel protective layer; therefore, a region on a side reverse of the side of a surface of an IGZO semiconductor layer in contact with a gate insulating film, a so-called back channel, can be protected from damages (such as reduction in film thickness due to plasma or an etchant at the time of etching and oxidation) in the process. Thus, reliability of a semiconductor device can be improved.

An embodiment of a manufacturing method of a semiconductor device according to the present invention includes the steps of forming a gate electrode over a substrate, forming a gate insulating film over the gate electrode, forming a semiconductor layer over the gate insulating film, forming a channel protective layer over the semiconductor layer and in a region that overlaps a channel formation region, forming a buffer layer having n-type conductivity over the semiconductor layer, and forming source and drain electrodes over the buffer layer, in which the semiconductor layer is formed using an oxide semiconductor layer including indium, gallium, and zinc; the buffer layer is formed using metal oxide having n-type conductivity and has a higher carrier concentration than the semiconductor layer; and the semiconductor layer and the source and drain electrodes are electrically connected to each other through the buffer layer.

In other words, an embodiment of the present invention is a manufacturing method of a semiconductor device which includes the steps of forming a gate electrode over a substrate, forming a gate insulating film over the gate electrode, forming an oxide semiconductor layer including indium, gallium, and zinc over the gate insulating film, forming a channel protective layer over the semiconductor layer and in a region that overlaps a channel formation region, forming a buffer layer using metal oxide having n-type conductivity over the semiconductor layer, and forming source and drain electrodes over the buffer layer, in which the semiconductor layer and the source and drain electrodes are electrically connected to each other through the buffer layer.

Another embodiment of a manufacturing method of a semiconductor device according to the present invention includes the steps of forming a gate electrode over a substrate, forming a gate insulating film over the gate electrode, forming a semiconductor layer over the gate insulating film, forming a channel protective layer over the semiconductor layer and in a region that overlaps a channel formation region, forming a buffer layer having n-type conductivity over the semiconductor layer, and forming source and drain electrodes over the buffer layer, in which the semiconductor layer is formed using an oxide semiconductor layer including indium, gallium, and zinc; the buffer layer is formed using metal oxide having n-type conductivity and has a higher carrier concentration than the semiconductor layer; the semiconductor layer and the source and drain electrodes are electrically connected to each other through the buffer layer; and the gate insulating film, the semiconductor layer, and the channel protective layer are formed without being exposed to air.

In other words, an embodiment of the present invention is a manufacturing method of a semiconductor device which includes the steps of forming a gate electrode over a substrate, forming a gate insulating film over the gate electrode, forming an oxide semiconductor layer including indium, gallium, and zinc over the gate insulating film, forming a channel protective layer over the semiconductor layer and in a region that overlaps a channel formation region, forming a buffer layer using metal oxide having n-type conductivity over the semiconductor layer, and forming source and drain electrodes over the buffer layer, in which the gate insulating film, the semiconductor layer, and the buffer layer are successively formed without being exposed to air; and the semiconductor layer and the source and drain electrodes are electrically connected to each other through the buffer layer, Further, by successively forming the gate insulating film, the semiconductor film, and the channel protective layer without exposing them to air, interfaces of the stacked films can be formed without being contaminated by an atmospheric component such as water vapor and impurity elements and dusts floating in the air. Thus, variations in thin film transistor characteristics can be reduced.

Successive film formation in this specification means that a series of steps from a first film formation step by a sputtering method to a second film formation step by a sputtering method is performed by controlling an atmosphere in which a process substrate is provided so that it is constantly in vacuum or an inert gas atmosphere (a nitrogen atmosphere or a rare gas atmosphere) without being exposed to a contaminated atmosphere such as the air. By the successive film formation, film formation can be performed without reattachment of moisture or the like to the process substrate, which has been cleaned.

Performing the series of steps from the first film formation step to the second film formation step in the same chamber is in the scope of the successive film formation in this specification.

Further, performing the series of steps from the first film formation step to the second film formation step in different chambers, in which after the first film formation step is completed, a substrate is transferred between the chambers without being exposed to air and the second film formation is performed, is also in the scope of the successive film formation in this specification.

Note that the case where there is a substrate transfer step, an alignment step, a slow cooling step, a step of heating or cooling a substrate so that the temperature of the substrate is suitable for the second film formation step, or the like between the first film formation step and the second film formation step is also in the scope of the successive film formation in this specification.

However, the case where there is a step in which liquid is used, such as a cleaning step, wet etching, or resist formation, between the first film formation step and the second film formation step is not in the scope of the successive film formation in this specification.

Successive formation of the gate insulating film, the semiconductor layer, and the channel protective layer by a sputtering method can not only increase productivity but also form interfaces of the stacked films with high reliability. Further, by forming the gate insulating film, the semiconductor layer, and the channel protective layer in an oxygen atmosphere, reduction in reliability due to deterioration, a shift of thin film transistor characteristics to the normally-on side, and the like can be suppressed.

An embodiment of the semiconductor device of the present invention includes a thin film transistor which includes a gate electrode, a gate insulating film which covers the gate electrode, an oxide semiconductor layer including indium, gallium, and zinc formed over the gate insulating film, a channel protective layer formed in a region that overlaps a channel formation region of the semiconductor layer, a buffer layer formed over the semiconductor layer, and source and drain electrodes formed over the buffer layer, in which the buffer layer includes metal oxide having n-type conductivity; and the semiconductor layer and the source and drain electrodes are electrically connected to each other through the buffer layer.

In addition, in the semiconductor device, the carrier concentration of the buffer layer may be higher than that of the semiconductor layer.

In the semiconductor device, the buffer layer may include an impurity imparting n-type conductivity.

Further, in the semiconductor device, the buffer layer may include indium, gallium, or zinc as an impurity.

In the semiconductor device, a second buffer layer having a carrier concentration higher than that of the semiconductor layer and lower than that of the buffer layer may be provided between the semiconductor layer and the buffer layer.

Further, in the semiconductor device, the buffer layer may include titanium.

In the semiconductor device, the source and drain electrodes may contain titanium.

Another embodiment of the invention disclosed is a manufacturing method of a semiconductor device which includes the steps of forming a gate electrode over a substrate, forming a gate insulating film over the gate electrode, forming a semiconductor layer over the gate insulating film, forming a channel protective layer over the semiconductor layer and in a region that overlaps a channel formation region, forming a buffer layer having n-type conductivity over the semiconductor layer, and forming source and drain electrodes over the buffer layer, in which the semiconductor layer is formed using an oxide semiconductor layer including indium, gallium, and zinc; the buffer layer is formed using metal oxide having n-type conductivity and has a higher carrier concentration than the semiconductor layer; and the semiconductor layer and the source and drain electrodes are electrically connected to each other through the buffer layer.

Further, another embodiment of the invention disclosed is a manufacturing method of a semiconductor device which includes the steps of forming a gate electrode over a substrate, forming a gate insulating film over the gate electrode, forming a semiconductor layer over the gate insulating film, forming a channel protective layer over the semiconductor layer and in a region that overlaps a channel formation region, forming a buffer layer having n-type conductivity over the semiconductor layer, and forming source and drain electrodes over the buffer layer, in which the semiconductor layer is formed using an oxide semiconductor layer including indium, gallium, and zinc; the buffer layer is formed using metal oxide having n-type conductivity and has a higher carrier concentration than the semiconductor layer; the semiconductor layer and the source and drain electrodes are electrically connected to each other through the buffer layer; and the gate insulating film, the semiconductor layer, and the channel protective layer are formed without being exposed to air.

In the manufacturing method of a semiconductor device, the gate insulating film, the semiconductor layer, and the channel protective layer may be formed by a sputtering method.

In the manufacturing method of a semiconductor device, the gate insulating film, the semiconductor layer, and the channel protective layer may be formed in an oxygen atmosphere.

In the manufacturing method of a semiconductor device, the buffer layer may be formed in a rare gas atmosphere.

According to an embodiment of the present invention, a thin film transistor having a small amount of photocurrent, low parasitic capacitance, a high on-off ratio, and favorable dynamic characteristics can be manufactured. Accordingly, a semiconductor device including a thin film transistor having excellent electric characteristics and high reliability can be provided.

BRIEF DESCRIPTION OF THE DRAWINGS

In the accompanying drawings:

FIGS. 3A1 to 3D are views illustrating a manufacturing method of a semiconductor device, according to an embodiment of the present invention;

FIGS. 17A1 to 17B are views illustrating a liquid crystal display device to which an embodiment of the present invention is applied;

DETAILED DESCRIPTION OF THE INVENTION

Figure 1A:
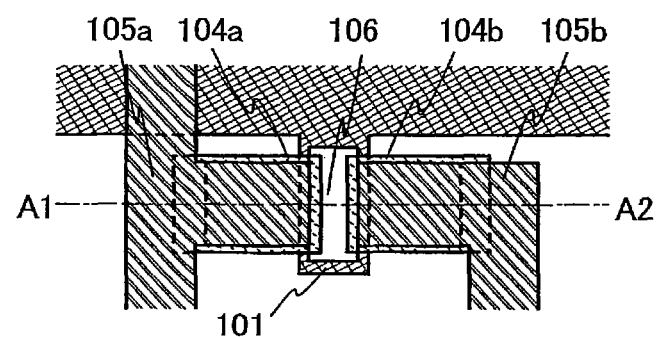
FIGS. 1A and 1B are views illustrating a semiconductor device according to an embodiment of the present invention.

Embodiments of the present invention will be described with reference to the accompanying drawings. However, the present invention is not limited to the following description, and it will be easily understood by those skilled in the art that various changes and modifications can be made to the modes and their details without departing from the spirit and scope of the present invention. Therefore, the present invention should not be construed as being limited to the description in the following embodiments. Note that a common reference numeral refers to the same part or a part having a similar function throughout the drawings in the structure of the present invention described below, and the description thereof is omitted.

Embodiment 1

In this embodiment, a thin film transistor and a manufacturing process thereof will be described with reference to FIGS. 1A and 1B and FIGS. 2A to 2D.

Figure 1B:
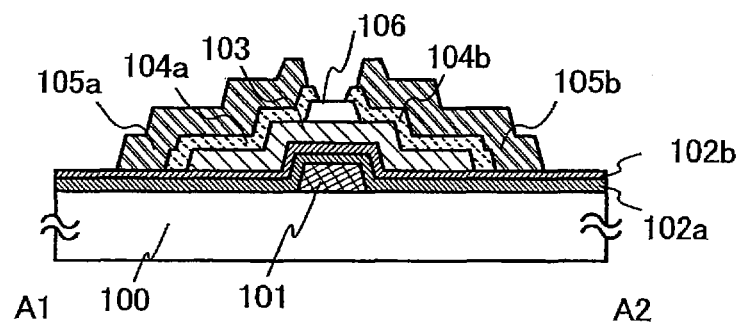

FIGS. 1A and 1B illustrate a thin film transistor having a bottom gate structure according to this embodiment. FIG. 1A is a plan view and FIG. 1B is a cross-sectional view taken along line A1-A2 in FIG. 1A. In the thin film transistor illustrated in FIGS. 1A and 1B, a gate electrode 101 is formed over a substrate 100; gate insulating films (102a, 102b) are formed over the gate electrode 101; an amorphous oxide semiconductor layer 103 functioning as a channel formation region is formed over the gate electrode 101 with the gate insulating films (102a, 102b) interposed therebetween; a channel protective layer 106 is formed in a region that overlaps with the channel formation region of the amorphous oxide semiconductor layer 103; buffer layers 104a and 104b are formed over the amorphous oxide semiconductor layer 103 so that edge portions of the buffer layers 104a and 104b overlap the gate electrode 101; and source and drain electrodes 105a and 105b are formed in contact with the buffer layers 104a and 104b.

An oxide semiconductor film containing In, Ga, and Zn is used for the semiconductor layer 103, and the buffer layers 104a and 104b having a higher carrier concentration than the semiconductor layer 103 are intentionally provided between the semiconductor layer 103 and the source and drain electrodes 105a and 105b, whereby an ohmic contact is formed.

The buffer layers 104a and 104b are formed using metal oxide. As the metal oxide used for the buffer layers 104a and 104b, titanium oxide, molybdenum oxide, zinc oxide, indium oxide, tungsten oxide, magnesium oxide, calcium oxide, tin oxide, or the like can be used. In particular, titanium oxide is preferable. Alternatively, metal oxide doped with another metal may be used. As a dopant, indium, gallium, aluminum, zinc, tin, or the like can be used. Doping can increase the concentration of carriers in the metal oxide.

The buffer layers 104a and 104b function as $n^+$ layers and can also be referred to as source and drain regions.

A manufacturing method of the thin film transistor illustrated in FIGS. 1A and 1B will be described with reference to FIGS. 2A to 2D.

Figure 2A:
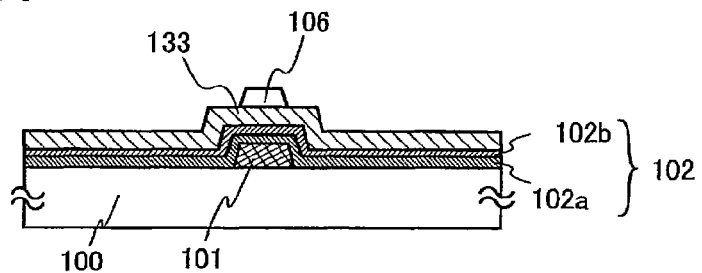
FIGS. 2A to 2D are views illustrating a manufacturing method of a semiconductor device, according to an embodiment of the present invention.

First, the gate electrode 101, the gate insulating film 102, a semiconductor film 133, the channel protective layer 106 are formed over the substrate 100 (see FIG. 2A).

As the substrate 100, any of the following substrates can be used: non-alkaline glass substrates manufactured by a fusion method or a float method, such as a barium borosilicate glass substrate, an aluminoborosilicate glass substarte, an aluminosilicate glass substrate, and the like; ceramic substrates; plastic substrates having heat resistance high enough to withstand a process temperature of this manufacturing process; and the like. Alternatively, a metal substrate of a stainless alloy or the like, which is provided with an insulating film over its surface, may be used. In the case where the substrate 100 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Further, an insulating film may be provided as a base film over the substrate 100. The base film can be formed to have a single-layer structure of a silicon oxide film, a silicon nitride film, a silicon oxynitride film, and/or a silicon nitride oxide film, or a stacked structure thereof by a CVD method, a sputtering method, or the like.

The gate electrode 101 is formed using a metal material. As the metal material, aluminum, chromium, titanium, tantalum, molybdenum, copper, or the like is applied. A preferred example of the gate electrode is formed using aluminum or a stack of aluminum and barrier metal. As the barrier metal, refractory metal such as titanium, molybdenum, or chromium is used. The barrier metal is preferably provided for preventing hillocks and oxidation of aluminum.

The gate electrode 101 is formed to a thickness of from 50 to 300 nm. By forming the gate electrode to a thickness of 300 nm or less, disconnection of a semiconductor film and wirings which are formed later can be prevented. Further, by forming the gate electrode to a thickness of 150 nm or more, resistance of the gate electrode can be reduced and thus the large size of the substrate can be used.

Note that since a semiconductor film and a wiring are to be formed over the gate electrode 101, it is desired that the gate electrode 101 be processed to have tapered end portions in order to prevent disconnection. In addition, although not illustrated, in this step, a wiring or a capacitor wiring connected to the gate electrode can also be formed at the same time.

The gate electrode 101 can be formed by a sputtering method, a CVD method, a plating method, or a printing method, or by using a conductive nanopaste of silver, gold, copper, or the like. Alternatively, the gate electrode 101 can be formed by discharging droplets containing conductive particles or the like by an ink-jet method and baking it. Note that here, an aluminum film and a molybdenum film are formed as a conductive film over the substrate by a sputtering method and is etched with the use of a resist mask formed using a first photomask of this embodiment, so that the gate electrode 101 is formed, as illustrated in FIG. 2A.

This embodiment describes an example in which a multi-layer film including stacked two insulating films is used as the gate insulating film 102. The first and second gate insulating films 102a and 102b can each be formed using a silicon oxide film, a silicon nitride film, a silicon oxynitride film, or a silicon nitride oxide film with a thickness of from 50 to 150 nm. Here, a mode is described in which a silicon nitride film or a silicon nitride oxide film is formed as the first gate insulating film 102a and a silicon oxide film or a silicon oxynitride film is formed as the second gate insulating film 102b. Note that the gate insulating film can be formed to have a single layer structure of a silicon oxide film, a silicon nitride film, a silicon oxynitride film, or a silicon nitride oxide film, instead of such a two-layer structure. Alternatively, the gate insulating film may be formed to have a three-layer structure.

By forming the first gate insulating film 102a using a silicon nitride film or a silicon nitride oxide film, adhesiveness between the substrate and the first gate insulating film 102a is increased, and in the case where a glass substrate is used as the substrate, an impurity can be prevented from diffusing into an oxide semiconductor film from the substrate and further, the gate electrode 101 can be prevented from being oxidized. That is to say, film peeling can be prevented, and thus electric characteristics of a thin film transistor to be completed later can be improved. Further, the first gate insulating film 102a and the second gate insulating film 102b each preferably have a thickness of 50 nm or more so that they can cover unevenness of the gate electrode 101.

Here, a silicon oxynitride film refers to a film that contains oxygen and nitrogen such that the amount of oxygen is larger than that of nitrogen and contains oxygen, nitrogen, silicon, and hydrogen at concentrations of 55 to 65 at. %, 1 to 20 at. %, 25 to 35 at. %, and 0.1 to 10 at. %, respectively. Further, a silicon nitride oxide film refers to a film that contains oxygen and nitrogen such that the amount of nitrogen is larger than that of oxygen and includes oxygen, nitrogen, silicon, and hydrogen at concentrations of 15 to 30 at. %, 20 to 35 at. %, 25 to 35 at. %, and 15 to 25 at. %, respectively.

Further, for the second gate insulating film 102b in contact with the semiconductor layer 103, silicon oxide, aluminum oxide, magnesium oxide, aluminum nitride, yttrium oxide, or hafnium oxide can be used for example.

The first gate insulating film 102a and the second gate insulating film 102b can each be formed by a CVD method, a sputtering method, or the like. Here, a silicon nitride film is formed by a plasma CVD method as the first gate insulating film 102a.

It is desirable to successively form the second gate insulating film 102b in contact with the semiconductor film 133, and the semiconductor film 133. By the successive film formation, an interface of the stacked films can be formed without being contaminated by an atmospheric component such as water vapor and impurity elements and dusts floating in the air. Thus, variations in thin film transistor characteristics can be reduced.

As for an active matrix display device, electric characteristics of a thin film transistor included in a circuit are significant and performance of the display device depends on the electric characteristics. The threshold voltage ($V_{th}$) is particularly significant among the electric characteristics of the thin film transistor. Even when field-effect mobility is high, if the value of the threshold voltage is high or below zero, it is difficult to control a circuit. A thin film transistor in which the value of the threshold voltage is high and the absolute value of the threshold voltage is large might not be able to achieve a switching function and might be a load in the state where the driving voltage is low. Further, in the case where the value of the threshold voltage is below zero, a thin film transistor is likely to be in a so-called normally-on state in which a current flows between a source electrode and a drain electrode even when a gate voltage is 0 V.

In the case of an n-channel thin film transistor, it is desirable that only after a positive voltage is applied as a gate voltage, a channel be formed and a drain current flows. A transistor in which a channel is not formed unless the driving voltage is high and a transistor in which even when a negative voltage is applied, a channel is formed and then a drain current flows are not suitable as a thin film transistor used for a circuit.

Therefore, also in the case of a thin film transistor using an oxide semiconductor film containing In, Ga, and Zn, a channel is desirably formed at a positive threshold voltage of the gate voltage which is as close to 0 V as possible.

A threshold voltage of a thin film transistor is considered to significantly depend on the interface of a semiconductor layer, that is, the interface between a semiconductor layer and a gate insulating film.

By forming the interface thereof so that it is clean, electric characteristics of a thin film transistor can be improved and a manufacturing process can be prevented from being complicated. Thus, both mass productivity and high performance of the thin film transistor can be achieved.

In particular, when moisture is at the interface between an oxide semiconductor layer and a gate insulating film, there occurs a problem such as degradation of electric characteristics of a thin film transistor, variations in threshold voltages, or normally-on. By successively forming the oxide semiconductor layer and the gate insulating film, such a hydrogen compound can be removed.

Thus, the gate insulating film and the oxide semiconductor film are successively formed under reduced pressure by a sputtering method without being exposed to air, so that a thin film transistor having a favorable interface, a small leakage current, and high current driving capability can be achieved.

Further, it is preferable to form the gate insulating film and the oxide semiconductor film containing In, Ga, and Zn in an oxygen atmosphere (or an atmosphere containing oxygen at 90% or more and a rare gas (such as argon) at 10% or less).

By thus successively forming the films by a sputtering method, productivity and reliability of an interface of the thin films can be increased. Further, by forming the gate insulating film and the semiconductor layer in an oxygen atmosphere so that they contain a large mount of oxygen, reduction in reliability due to deterioration and normally-on of a thin film transistor can be suppressed.

Further, it is also desirable to perform successive formation in which an insulating film to be a channel protective layer 106 is formed following the formation of the semiconductor film. By the successive film formation, an interface of the stacked films can be formed in a region on a side reverse of the side of a surface of the semiconductor film in contact with a gate insulating film, a so-called back channel, without being contaminated by an atmospheric component such as water vapor and impurity elements and dusts floating in the air. Thus, variations in thin film transistor characteristics can be reduced.

For a method for successive film formation, a multi-chamber sputtering apparatus equipped with a plurality of film formation chambers, a sputtering apparatus provided with a plurality of targets, or a PLD apparatus may be used. In the case of depositing silicon oxide for the insulating film, the insulating film can be formed by a high frequency sputtering method or a reactive sputtering method using silicon oxide (artificial quartz) or single crystal silicon as a target. Note that here, a semiconductor film and a silicon oxide film to be a channel protective layer are successively formed without being exposed to the air after formation of a silicon oxide film as the second gate insulating film 102b in contact with the semiconductor film by using a multi-chamber sputtering apparatus provided with a single crystal silicon target and a target for the semiconductor film.

The semiconductor layer 103 is formed using an amorphous oxide semiconductor film. For the amorphous oxide semiconductor film, a composite oxide of an element such as indium, gallium, aluminum, zinc, or tin can be used. For example, oxide containing indium, gallium, and zinc (IGZO) can be given as an example of the composite oxide.

In the case of oxide formed using indium oxide, gallium oxide, and zinc oxide, the composition ratio of the metal elements is highly flexibly set and the oxide functions as a semiconductor layer at a wide range of mixture ratio. For example, a material in which indium oxide, gallium oxide, and zinc oxide are mixed in an equimolar ratio, and oxide containing In, Ga, and Zn at a ratio of 2.2:2.2:1.0 can be given.

The oxide semiconductor film 133 used for the semiconductor layer 103 is preferably formed to a thickness of from 2 nm to 200 nm, more preferably from 20 to 150 nm. Further, when the oxygen vacancy rate in the film is increased, a carrier concentration is increased and thus thin film transistor characteristics are degraded. Therefore, the composition is determined so that oxygen vacancy is suppressed.

The amorphous oxide semiconductor film 133 can be formed by a reactive sputtering method, a pulsed laser deposition method (PLD method), or a sol-gel method. Here, a method using oxide containing indium, gallium, and zinc (IGZO) is described as an example of a method for forming the semiconductor film 133.

A target with a diameter of 8 inch obtained by mixing indium oxide ($In_2O_3$), gallium oxide ($Ga_2O_3$), and zinc oxide (ZnO) in an equimolar ratio and performing sintering is used, a substrate is provided 170 mm apart from the target, and direct current (DC) sputtering is performed with an output of 500 W, so that the semiconductor film 133 is formed. The semiconductor film 133 is formed to a thickness of 50 nm under the conditions that the chamber pressure is 0.4 Pa and the gas composition ratio of Ar to $O_2$ is 10/5 sccm. It is desirable that an oxygen partial pressure in film formation be set higher than that in forming a transparent conductive film of indium tin oxide (ITO) or the like to control the oxygen concentration in a film formation atmosphere so that oxygen vacancy is suppressed. Further, it is preferable to use a pulsed direct current (DC) power supply because dusts can be reduced and the thickness distribution can be uniform.

Note that the semiconductor layer 103 may be subjected to plasma treatment. By the plasma treatment, damages of the semiconductor layer 103 due to etching can be repaired. The plasma treatment is preferably performed in an atmosphere of $O_2$, $H_2O$, or $N_2O$, or preferably an atmosphere of $H_2$, $N_2$, He, Ar, H, or $NH_3$ containing oxygen. Alternatively, the plasma treatment may be performed in the above atmosphere to which $Cl_2$ and $CF_4$ is added. Note that the plasma treatment is preferably performed with non-bias.

Note that in this embodiment, the semiconductor film 133 is formed over the second gate insulating film 102b formed in the former step without exposing the second gate insulating film 102b to air by using a multi-chamber sputtering apparatus provided with a target for an oxide semiconductor film and single crystal silicon. In the following step, an insulating film to be the channel protective layer 106 is formed over the formed semiconductor film 133 without exposing the semiconductor film 133 to air.

The channel protective layer 106 is formed using an insulating film in a region overlapping with a channel formation region of the semiconductor layer 103 as in FIG. 2A. The insulating film functioning as the channel protective layer 106 can be formed using an inorganic material (such as silicon oxide, silicon nitride, silicon oxynitride, or silicon nitride oxide). Further, a film formed using one or a plurality of kinds of photosensitive or nonphotosensitive organic materials (organic resin materials) (such as polyimide, acrylic, polyamide, polyimide amide, resist, and benzocyclobutene) or a stack of such films can be used. Further, siloxane may be used.

The insulating film to be the channel protective layer 106 can be formed by a vapor phase growth method such as a plasma CVD method or a thermal CVD method, or a sputtering method. Alternatively, an application method such as a spin coating method which is a wet process may be used. Alternatively, the insulating film may be selectively formed by a droplet discharge method, a printing method (a method for forming a pattern, such as screen printing or offset printing), or the like.

Note that here, a silicon oxide film to be the channel protective layer 106 is formed without exposing the oxide semiconductor film formed in the former step to air by using a multi-chamber sputtering apparatus provided with single crystal silicon and a target for the oxide semiconductor film. Next, the silicon oxide film formed over the semiconductor film 133 is selectively etched using a resist mask formed with the use of a second photomask of this embodiment, so that the channel protective layer 106 is formed as in FIG. 2A. Next, the semiconductor film 133 formed over the gate insulating films is etched by using a resist mask formed with the use of a third photomask of this embodiment, so that the semiconductor layer 103 is formed.

Note that as a method for etching a film of oxide containing indium, gallium, and zinc (IGZO), a wet etching method can be used. An organic acid such as a citric acid or an oxalic acid can be used for an etchant. For example, a film of oxide containing indium, gallium, and zinc (IGZO) with a thickness of 50 nm can be etched in 150 seconds by using the ITO07N (manufactured by Kanto Chemical Co., Inc.).

The pair of buffer layers 104a and 104b over the amorphous oxide semiconductor film are formed using metal oxide. As the metal oxide used for the buffer layers 104a and 104b, titanium oxide, molybdenum oxide, zinc oxide, indium oxide, tungsten oxide, magnesium oxide, calcium oxide, tin oxide, or the like can be used. In particular, titanium oxide is preferable.

Alternatively, metal oxide doped with another metal may be used. As a dopant, indium, gallium, aluminum, zinc, tin, or the like can be used. Doping can increase the concentration of carriers in the metal oxide.

The buffer layers 104a and 104b have a higher carrier concentration than the semiconductor layer 103 formed using oxide containing indium, gallium, and zinc (IGZO) and thus has excellent conductivity. Therefore, in the case of providing the buffer layers 104a and 104b, contact resistance can be reduced as compared to the case where the semiconductor layer 103 and the source and drain electrodes 105a and 105b are directly attached to each other. Further, by providing the buffer layers 104a and 104b at the bonding interface between the semiconductor layer 103 and the source and drain electrodes 105a and 105b, an electric field concentrated at the bonding interface can be reduced.

Figure 2B:
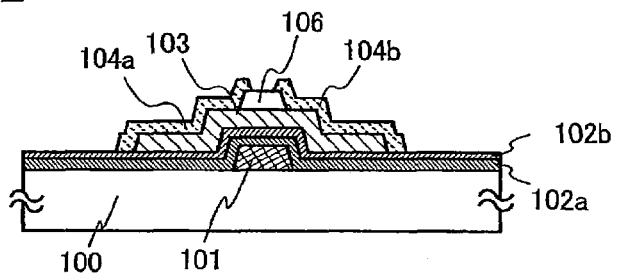

Note that in order that the buffer layers (104a, 104b) cover the semiconductor layer 103 reliably, patterning may be performed so that the buffer layers are also provided over part of the channel protective layer 106 as in FIG. 2B.

The oxide semiconductor film which is to be the buffer layers 104a and 104b is preferably formed to a thickness of from 2 nm to 100 nm.

The metal oxide film to be the buffer layers (104a, 104b) can be formed by a sputtering method or a pulsed laser deposition method (PLD method). Here, a titanium oxide film is formed by a sputtering method. Next, the titanium oxide film formed over the semiconductor layer 103 and the channel protective layer 106 is dry-etched or wet-etched using a resist mask formed with the use of a fourth photomask in this embodiment; thus, the buffer layers 104a and 104b are formed. As a method of etching titanium oxide, a wet etching method can be given for example. A diluted hydrofluoric acid, a diluted hydrochloric acid, a diluted sulfuric acid, or a solution in which ammonia water, hydrogen peroxide water, and pure water are mixed at a volume ratio of 1:1:5 can be used as an etchant.

The source and drain electrodes 105a and 105b are formed using a conductive film, and the same material as the gate electrode 101 can be used. In particular, a layer in contact with the buffer layers 104a and 104b is preferably a titanium film. As specific examples of the conductive film, a single titanium film, a layered film including a titanium film and an aluminum film, and a three-layer film in which a titanium film, an aluminum film, and a titanium film are sequentially stacked are given.

Figure 2C:
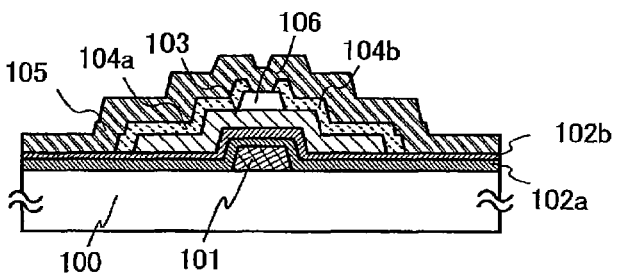
Figure 2D:
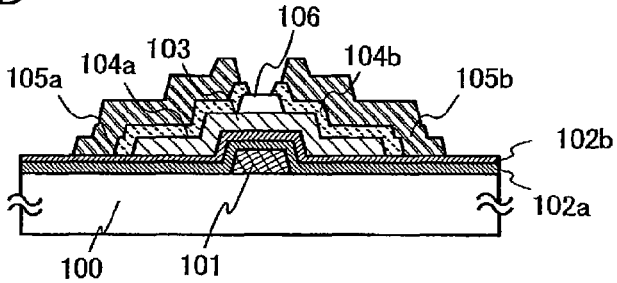

Here, a three-layer film including a titanium film, an aluminum film, and a titanium film is formed over the buffer layers 104a and 104b and the channel protective layer by a sputtering method as in FIG. 2C. Next, the conductive film formed over the channel protective layer 106 is etched to be divided by using a resist mask formed with the use of a fifth photomask of this embodiment, so that the source and drain electrodes 105a and 105b are formed as in FIG. 2D. Note that the three-layer film in which a titanium film, an aluminum film, and a titanium film are sequentially stacked can be etched using a hydrogen peroxide solution or a heated hydrochloric acid as an etchant.

Note that in this embodiment, formation of the buffer layers 104a and 104b and formation of the source and drain electrodes 105a and 105b are performed separately, so that the lengths of a part where end portions of the buffer layer 104a and the source or drain electrode 105a overlap with each other and a part where end portions of the buffer layer 104b and the source or drain electrode 105b overlap with each other can be easily controlled.

The characteristics of the thin film transistor using oxide containing indium, gallium, and zinc (IGZO) described in this embodiment for the semiconductor layer 103 can be improved by performing heat treatment on the semiconductor layer 103 formed. Specifically, an ON current is increased and variations in transistor characteristics are reduced.

The semiconductor layer 103 is heated at preferably 300° C. to 400° C. Here, the semiconductor layer 103 is heated at 350° C. for one hour. The heat treatment may be performed at any timing after formation of the semiconductor layer 103. For example, the heat treatment may be performed after the semiconductor layer 103 and the insulating film to be the channel protective layer 106 are successively formed, after the channel protective layer 106 is patterned, or after the metal oxide film to be the buffer layers 104a and 104b is formed. Alternatively, the heat treatment may be performed after the conductive film to be the source and drain electrodes 105a and 105b is formed or after a sealing film of the thin film transistor is formed. Alternatively, the heat treatment of the semiconductor layer 103 may be performed also as a heat curing treatment of a planarization film formed over the thin film transistor.

According to the above description, the amorphous oxide semiconductor layer 103, the channel protective layer 106, the buffer layers 104a and 104b, and the source and drain electrodes 105a and 105b which are illustrated in FIGS. 1A and 1B are formed.

The thin film transistor according to an embodiment of the present invention has a layered structure including the gate electrode, the gate insulating films, the semiconductor layer (the oxide semiconductor layer containing In, Ga, and Zn), the buffer layers, the channel protective layer, and the source and drain electrodes. By using the buffer layers having a higher carrier concentration than the semiconductor layer, parasitic capacitance can be reduced with the thickness of the semiconductor layer kept small.

The thin film transistor according to an embodiment of the present invention is provided with the channel protective layer 106; therefore, a region on a side reverse of the side of a surface of an oxide semiconductor film in contact with the gate insulating film 102b, a so-called back channel, can be protected from damages (such as reduction in film thickness due to plasma or an etchant at the time of etching and oxidation) in the process. Thus, reliability of the thin film transistor can be improved.

Note that since the channel protective layer 106 functions as an etching stopper in the etching step for forming the semiconductor layer 103, it can also be referred to as a channel stopper layer.

Further, in this embodiment, the edges of the source and drain electrodes 105a and 105b are on outer sides than the edges of the buffer layers 104a and 104b over the channel protective layer 106 so that they are apart from each other;

therefore, a leakage current and a short circuit between the source and drain electrodes 105a and 105b can be prevented.

Thus, by applying an embodiment of the present invention, a thin film transistor having a small amount of photocurrent, low parasitic capacitance, and a high on-off ratio can be obtained and thus a thin film transistor having favorable dynamic characteristics (f characteristics) can be manufactured. Accordingly, a semiconductor device including a thin film transistor having excellent electric characteristics and high reliability can be provided.

Embodiment 2

In this embodiment, the structure of a thin film transistor in which a buffer layer includes titanium oxide, which is different from the structure of Embodiment 1, will be described with reference to FIGS. 3A1 to 3D. In addition, in this embodiment, the same reference numerals are used for the same portions as those in Embodiment 1 and detailed description of the portions is omitted.

Through a similar process to that of Embodiment 1, a channel protective layer 106 is formed using an insulating film in a region that overlaps a channel formation region of a semiconductor layer 103 as illustrated in FIG. 3A1. Note that by the etching processing of the channel protective layer 106, the surface of the semiconductor layer 103 which is to be attached to buffer layers may be etched as illustrated in FIG. 3A2. By etching the surface of the oxide semiconductor layer which is to be attached to the buffer layers, the oxide semiconductor layer can be more favorably attached to the buffer layers.

In other words, through a process similar to that of Embodiment 1, the channel protective layer 106 is formed over a semiconductor film 133 and in a region that overlaps a gate electrode 101. Note that in a step of forming the channel protective layer 106, the surface of the semiconductor film 133 may be etched as illustrated in FIG. 3A2. The surface of the semiconductor film 133 in an opening portion of the channel protective layer 106 is etched; as a result, the surface can be favorably attached to a metal oxide film 134 that is formed next and is to be buffer layers. Note that in this embodiment, explanation will be made based on the embodiment of FIG. 3A2.

In this embodiment, titanium oxide is deposited as the metal oxide film 134 to be buffer layers as illustrated in FIG. 3B. After the metal oxide film 134 to be buffer layers is formed in a manner similar to that described in Embodiment 1, without patterning of the metal oxide film 134, a conductive film 105 to be source and drain electrodes 105a and 105b is stacked over the metal oxide film 134 as illustrated in FIG. 3C.

The conductive film 105 is formed in a manner similar to that of Embodiment 1. Here, a three-layer film is formed by a sputtering method as the conductive film 105. For example, a titanium film, an aluminum film, and a titanium film can be used for source and drain electrodes 105a1 and 105b1, source and drain electrodes 105a2 and 105b2, and source and drain electrodes 105a3 and 105b3, respectively.

In other words, the source and drain electrodes (105a and 105b) in which the first conductive layers (105a1, 105b1) formed of titanium, the second conductive layers (105a2, 105b2) formed of aluminum, and the third conductive layers (105a3, 105b3) formed of titanium are stacked are formed using the conductive film 105 formed by stacking titanium for the first conductive film, aluminum for the second conductive film, and titanium for the third conductive film.

Next, the conductive film 105 is etched using a resist mask that is formed with the use of a fourth photomask of this embodiment.

The source and drain electrodes 105a2, 105a3, 105b2, and 105b3 are etched by wet etching using the source and drain electrodes 105a1 and 105b1 as etching stoppers. With the use of the same mask that is used in the above wet etching, the source and drain electrodes 105a1 and 105b1, buffer layers 104a and 104b, and the semiconductor layer 103 are etched by dry etching. Accordingly, as illustrated in FIG. 3D, an edge portion of the source or drain electrode 105a1 is aligned with an edge portion of the buffer layer 104a, and an edge portion of the source or drain electrode 105b1 is aligned with an edge portion of the buffer layer 104b. In addition, edge portions of the source or drain electrodes 105a2 and 105a3 and edge portions of the source or drain electrodes 105b2 and 105b3 are on inner sides than the edge portion of the source or drain electrode 105a1 and the edge portion of the source or drain electrode 105b1, respectively.

In other words, first, the titanium film, which is the third conductive film, is etched to form the third conductive layers (105a3, 105b3), and next, the aluminum film, which is the second conductive film, is etched using the titanium film, which is the first conductive film, as an etching stopper to form the second conductive layers (105a2, 105b2). Further, the titanium film, which is the first conductive film, and the metal oxide film 134 are dry-etched using the same resist mask that is used in the above wet etching, so that the first conductive layers (105a1, 105b1) and the buffer layers (104a, 104b) are formed. By formation of the source and drain electrodes (105a, 105b) through this process, edge portions of the first conductive layers (105a1, 105b1) are aligned with edge portions of the buffer layers (104a, 104b), and edge portions of the second conductive layers (105a2, 105b2) and the third conductive layers (105a3, 105b3) are on inner sides than the edge portions of the first conductive layers (105a1, 105b1). Note that the cross-sectional view at this stage is illustrated in FIG. 3D.

Thus, when the etching selectivity of the conductive film used for the source and drain electrodes to the buffer layers and the semiconductor layer is low, it is preferable to perform an etching step plural times under different etching conditions by stacking a conductive film functioning as an etching stopper.

Further, heat treatment of the formed semiconductor layer 103 is performed in a manner similar to that of Embodiment 1.

According to this embodiment, since the buffer layers 104a and 104b and the source and drain electrodes 105a and 105b are patterned using the resist mask formed with the same photomask, the number of photomasks used can be reduced compared to that of Embodiment 1. Thus, the number of steps can be reduced by combining plural steps to one step, whereby yield can be improved and manufacturing time can be shortened.

Embodiment 3

In this embodiment, the structure of a thin film transistor including a buffer layer, which is different from the structures of Embodiments 1 and 2, will be described with reference to FIGS. 4A to 4D. In addition, in this embodiment, the same reference numerals are used for portions the same as those in Embodiment 1 and detailed description of the portions is omitted.

Figure 4A:
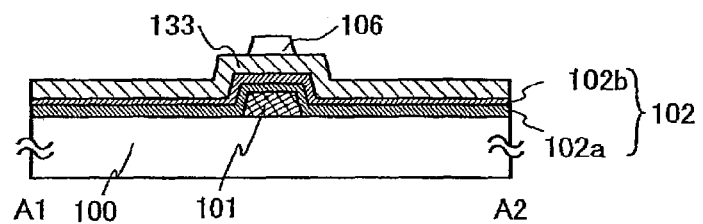
FIGS. 4A to 4D are views illustrating a manufacturing method of a semiconductor device, according to an embodiment of the present invention.

Through a process similar to that of Embodiment 2, a channel protective layer 106 is formed over a semiconductor film 133 of an oxide including indium, gallium, and zinc (IGZO) to be a semiconductor layer 103 as illustrated in FIG. 4A.

Figure 4B:
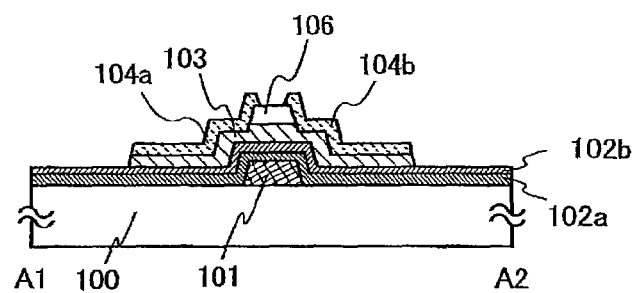

In this embodiment, without formation of the semiconductor layer 103 by selective etching of the semiconductor film 133, a metal oxide film to be buffer layers 104a and 104b is formed over the semiconductor film 133 by a method similar to that of Embodiment 1. Next, the buffer layers 104a and 104b and the semiconductor layer 103 are formed as illustrated in FIG. 4B, using a resist mask that is formed with the use of a third photomask of this embodiment.

Figure 4C:
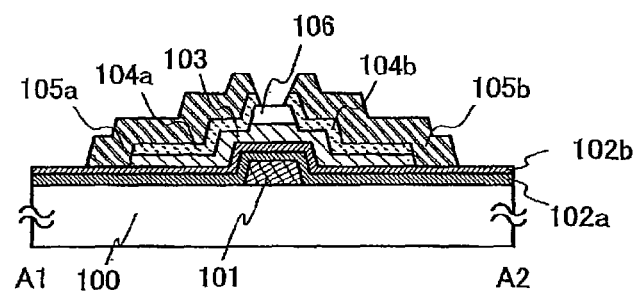
Figure 4D:
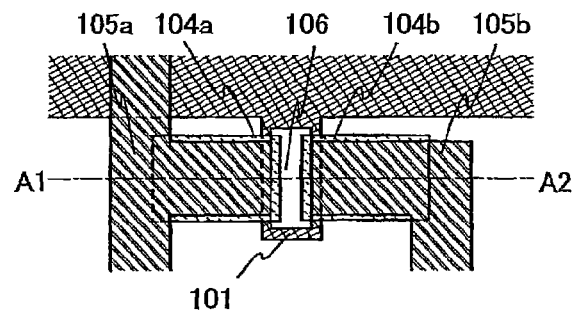

Source and drain electrodes 105a and 105b are formed using a conductive film in a manner similar to that of Embodiment 1. Here, a three-layer film of a titanium film, an aluminum film, and a titanium film is formed by a sputtering method as the conductive film over the buffer layers 104a and 104b and the channel protective layer 106. Next, the conductive film is partially removed by etching with the use of a resist mask formed with a fourth photomask of this embodiment, so that the source and drain electrodes 105a and 105b are formed as illustrated in FIG. 4C. FIG. 4D is a plan view and FIG. 4C is a cross-sectional view taken along line A1-A2 of FIG. 4D.

Further, heat treatment of the formed semiconductor layer 103 is performed in a manner similar to that of Embodiment 1.

According to this embodiment, since the buffer layers 104a and 104b and the semiconductor layer 103 are patterned by one etching step, the number of photomasks used can be reduced compared to that of Embodiment 1. Thus, the number of steps can be reduced by combining plural steps to one step, whereby yield can be improved and manufacturing time can be shortened.

Embodiment 4

Figure 5A:
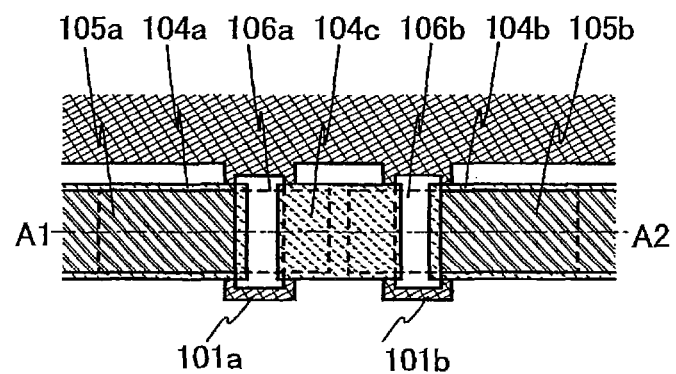
FIGS. 5A and 5B are views illustrating a semiconductor device according to an embodiment of the present invention.
Figure 5B:
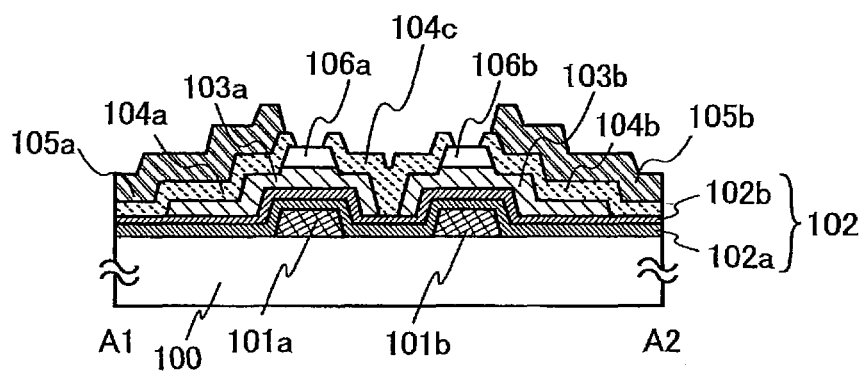
Figure 6A:
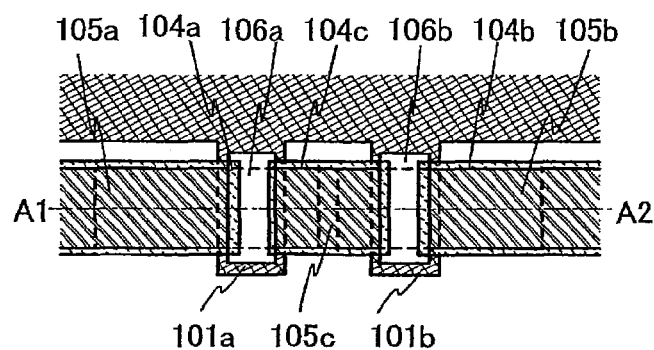
FIGS. 6A and 6B are views illustrating a semiconductor device according to an embodiment of the present invention.
Figure 6B:
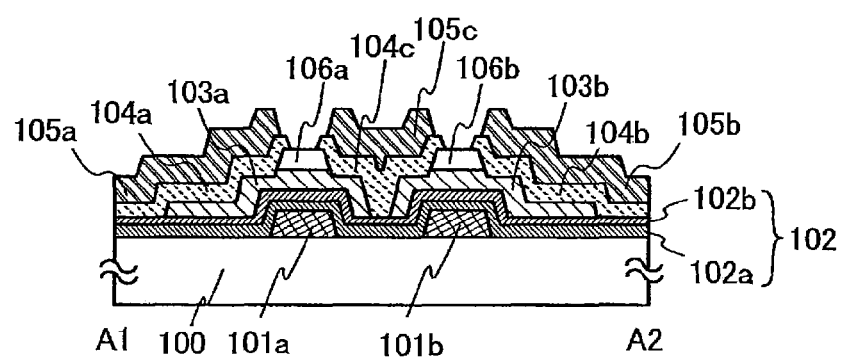
Figure 7A:
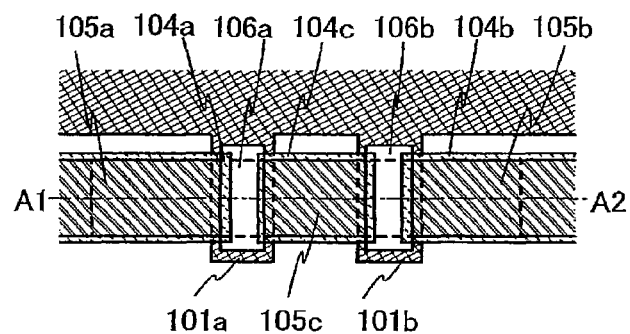
FIGS. 7A and 7B are views illustrating a semiconductor device according to an embodiment of the present invention.
Figure 7B:
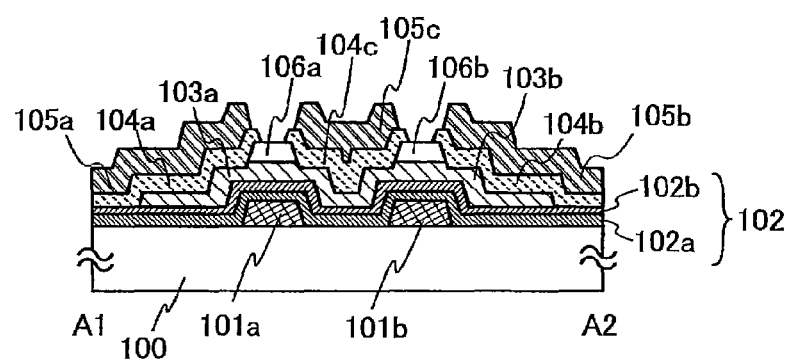

In this embodiment, a thin film transistor including a plurality of electrically-connected gate electrodes and a buffer layer will be described with reference to FIGS. 5A and 5B, FIGS. 6A and 6B, and FIGS. 7A and 7B. FIG. 5A is a plan view, and FIG. 5B is a cross-sectional view taken along line A1-A2 of FIG. 5A. FIG. 6A is a plan view, and FIG. 6B is a cross-sectional view taken along line A1-A2 of FIG. 6A. FIG. 7A is a plan view, and FIG. 7B is a cross-sectional view taken along line A1-A2 of FIG. 7A. In addition, in this embodiment, the same reference numerals are used for portions the same as those in Embodiment 1 and detailed description of the portions is omitted. Note that the structure in which two channel formation regions are connected is employed in this embodiment; however, the structure is not limited thereto and the structure may be a so-called multi-gate structure (the structure including two or more channel formation regions which are connected in series) such as a triple-gate structure in which three channel formation regions are connected.

As the mode of the thin film transistor of this embodiment in which two channel regions are connected, there are three modes: a mode in which two channel regions are connected by only the buffer layer 104c (FIGS. 5A and 5B), a mode in which two channel regions are connected by the buffer layer 104c and the conductive layer 105c (FIGS. 6A and 6B), and a mode in which two channel regions are connected by the semiconductor layer 103, the buffer layer 104c, and the conductive layer 105c (FIGS. 7A and 7B). By changing the portion of the photomask for an appropriate layer, which is located between a first gate electrode 101a and a second gate electrode 101b, these thin film transistors can be formed by a method similar to that of Embodiment 1.

Such a multi-gate structure is very effective for reducing the OFF current value.

Embodiment 5

Figure 8:
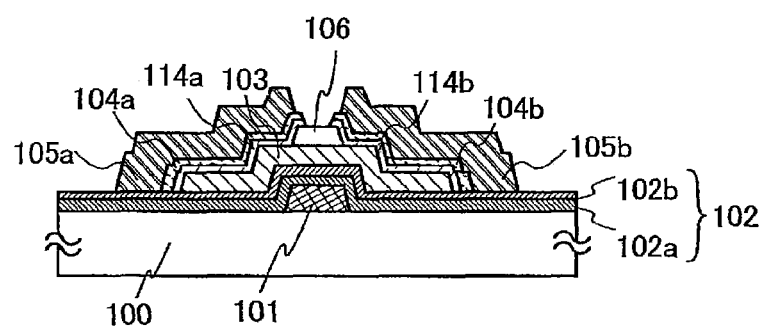
FIG. 8 is a view illustrating a semiconductor device according to an embodiment of the present invention.

This embodiment will describe the structure of a thin film transistor including buffer layers, which is different from the structures of Embodiments 1 to 4 with reference to FIG. 8. Note that since the thin film transistor of this embodiment except the buffer layers can be formed by a method similar to the method described in Embodiment 1, only the buffer layers will be specifically described.

The buffer layers of this embodiment each include a first buffer layer and a second buffer layer. The first buffer layers 104a and 104b are in contact with source and drain electrodes and second buffer layers 114a and 114b are sandwiched between the first buffer layers 104a and 104b and the semiconductor layer 103.

That is to say, the buffer layers of this embodiment are the first buffer layer 104a in contact with one of the source electrode and the drain electrode, the first buffer layer 104b in contact with the other, the second buffer layer 114a sandwiched between the first buffer layer 104a and the semiconductor layer 103, and the second buffer layer 114b sandwiched between the first buffer layer 104b and the semiconductor layer 103.

The first buffer layers 104a and 104b and the second buffer layers 114a and 114b are each formed using metal oxide. As the metal oxide functioning as the first buffer layers 104a and 104b and the second buffer layers 114a and 114b, titanium oxide, molybdenum oxide, zinc oxide, indium oxide, tungsten oxide, magnesium oxide, calcium oxide, tin oxide, or the like can be used. In particular, titanium oxide is preferably used.

Alternatively, metal oxide doped with another metal may be used. As the dopant, for example, indium, gallium, aluminum, zinc, tin, lead, and the like can be given. By the doping, the carrier concentration in the metal oxide can be increased. For example, a mixed film may be formed by a sputtering method using IGZO as a first target and metal oxide as a second target at the same time (co-sputtering) and may be used as the buffer layers.

The first buffer layers 104a and 104b and the second buffer layers 114a and 114b have a higher carrier concentration than the semiconductor layer 103 of oxide containing indium, gallium, and zinc (IGZO) and thus has excellent conductivity. The material of the first buffer layers 104a and 104b is selected so that the first buffer layers 104a and 104b have a higher carrier concentration than the second buffer layers 114a and 114b. For example, metal oxide can be used for the first buffer layers and a mixed film of IGZO and metal oxide can be used for the second buffer layers. By making the carrier concentration gradient so that the carrier concentration is increased from the semiconductor layer 103 toward the source and drain electrode layers 105a and 105b, contact resistance between the semiconductor layer 103 and the source and drain electrode layers 105a and 105b can be reduced.

Further, by providing the buffer layers having the gradient in which the carrier concentration is increased from the semiconductor layer 103 side toward the side of the source and drain electrodes 105a and 105b at the bonding interface between the semiconductor layer 103 and the source and drain electrodes 105a and 105b, an electric field concentrated at the joint interface can be alleviated.

Embodiment 6

In this embodiment, a manufacturing example of an inverted staggered thin film transistor will be described, in which at least a gate insulating film and an oxide semiconductor film are successively formed without being exposed to air. In this embodiment, steps up to the successive film formation will be described, and steps after the successive film formation may be carried out in accordance with any of Embodiments 1 to 5 to manufacture a thin film transistor.

Figure 9:
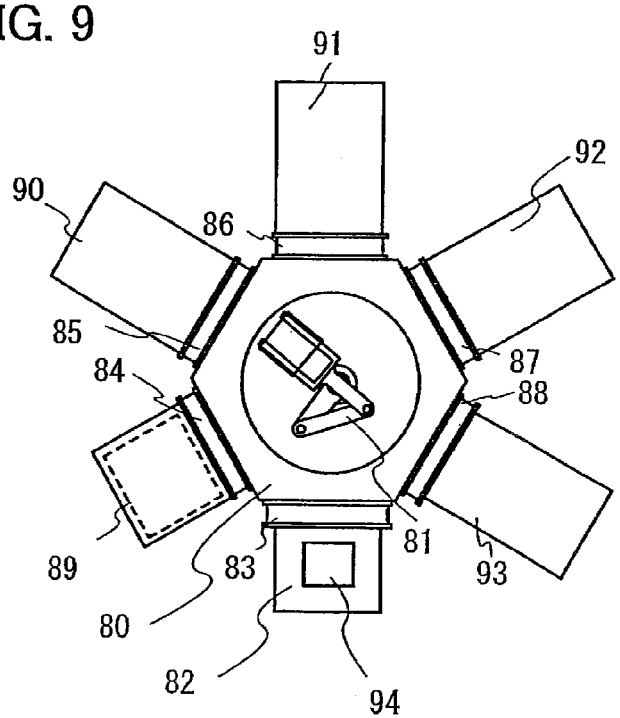
FIG. 9 is a top schematic view illustrating a multi-chamber manufacturing apparatus.

When films are successively formed without being exposed to air, a multi-chamber manufacturing apparatus as illustrated in FIG. 9 is preferably used.

At the center of the manufacturing apparatus, a transfer chamber 80 equipped with a transfer mechanism (typically, a transfer robot 81) for transferring a substrate is provided. A cassette chamber 82 in which a cassette case storing a plurality of substrates carried into and out of the transfer chamber 80 is set is connected to the transfer chamber 80.

In addition, a plurality of treatment chambers are connected to the transfer chamber 80 through gate valves 84 to 88. In this embodiment, an example in which five treatment chambers are connected to the transfer chamber 80 having a hexagonal top shape is illustrated. Note that, by changing the top shape of the transfer chamber 80, the number of treatment chambers which can be connected to the transfer chamber can be changed. For example, three treatment chambers can be connected to a transfer chamber having a tetragonal shape, or seven treatment chambers can be connected to a transfer chamber having an octagonal shape.

At least one treatment chamber among the five treatment chambers is a sputtering chamber in which sputtering is performed. The sputtering chamber is provided with, at least inside the chamber, a sputtering target, a mechanism for applying electric power or a gas introduction means for sputtering the target, a substrate holder for holding a substrate at a predetermined position, and the like. Further, the sputtering chamber is provided with a pressure control means with which the pressure in the chamber is controlled, so that the pressure is reduced in the sputtering chamber.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of depositing an insulating film, and a DC sputtering method is mainly used in the case of depositing a metal film.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited by electric discharge at the same time in the same chamber.

In addition, there are a sputtering apparatus provided with a magnet system inside the chamber and used for a magnetron sputtering method, or a sputtering apparatus used for an ECR sputtering method in which plasma generated with the use of microwaves is used without using glow discharge.

In the sputtering chamber of this embodiment, any of various sputtering methods described above is used as appropriate.

In addition, as a deposition method, there are also a reactive sputtering method in which a target substance and a sputtering gas component are chemically reacted with each other during deposition to form a thin compound film thereof, and a bias sputtering method in which voltage is also applied to a substrate during deposition.

In addition, among the five treatment chambers, one of the other treatment chambers than the sputtering chamber is a heating chamber in which a substrate is preheated or the like before sputtering, a cooling chamber in which a substrate is cooled after sputtering, or a chamber in which plasma treatment is performed.

Next, an example of an operation of the manufacturing apparatus will be described.

A substrate cassette storing a substrate 94 whose deposition target surface faces downward is set in the cassette chamber 82, and the cassette chamber 82 is placed in a reduced pressure state by a vacuum evacuation means provided in the cassette chamber 82. In each of the treatment chambers and the transfer chamber 80, the pressure is reduced in advance by a vacuum evacuation means provided in each chamber. Accordingly, during transferring the substrate between the treatment chambers, the substrate is not exposed to air and can be kept clean.

Note that at least a gate electrode is provided in advance for the substrate 94 which is placed so that its deposition target surface faces downward. For example, a base insulating film such as a silicon nitride film or a silicon nitride oxide film may also be provided by a plasma CVD method between the substrate and the gate electrode. When a substrate formed of glass containing alkali metal is used as the substrate 94, the base insulating film has an effect of preventing mobile ions of sodium or the like from entering a semiconductor region from the substrate so that variation in electric characteristics of a TFT can be suppressed.

Here, a substrate over which a silicon nitride film covering the gate electrode is formed by a plasma CVD method to form a first layer of a gate insulating film is used. The silicon nitride film formed by a plasma CVD method is dense, so that generation of pin holes or the like can be suppressed by using this silicon nitride film as the first layer of the gate insulating film. Although this embodiment shows an example in which the gate insulating film has a stacked structure, the present invention is not limited thereto, and the gate insulating film may be a single layer or have a stacked structure including three or more layers.

Then, the gate valve 83 is opened and the substrate 94 which is the first substrate is picked up from the cassette by the transfer robot 81. After that, the gate valve 84 is opened, the substrate 94 is transferred to a first treatment chamber 89, and then, the gate valve 84 is closed. In the first treatment chamber 89, by heating the substrate 94 by a heater or a lamp, moisture or the like attached to the substrate 94 is removed. In particular, when the gate insulating film contains moisture, electric characteristics of a TFT could possibly be changed; therefore, heating before sputtering deposition is effective. In the case where moisture has been sufficiently removed at the time when the substrate is set in the cassette chamber 82, this heating treatment is not necessary.

In addition, plasma treatment may be performed on the surface of the first layer of the gate insulating film by providing a plasma treatment means in the first treatment chamber 89. Furthermore, heating for removing moisture may be performed in the cassette chamber 82 by providing a heating means in the cassette chamber 82.

Then, the gate valve 84 is opened and the substrate is transferred to the transfer chamber 80 by the transfer robot 81. After that, the gate valve 85 is opened and the substrate is transferred to a second treatment chamber 90, and the gate valve 85 is closed.

In this embodiment, the second treatment chamber 90 is a sputtering chamber in which sputtering is performed using an RF magnetron sputtering method. In the second treatment chamber 90, a silicon oxide ($SiO_x$ (x>0)) film is deposited as a second layer of the gate insulating film. As the second layer of the gate insulating film, in addition to a silicon oxide film, an aluminum oxide ($Al_2O_3$) film, a magnesium oxide ($MgO_x$ (x>0)) film, an aluminum nitride ($AlN_x$ (x>0)) film, an yttrium oxide ($YO_x$ (x>0)) film, or the like can be used.

A small amount of a halogen element such as fluorine or chlorine may be added to the second layer of the gate insulating film so that mobile ions of sodium or the like can be immobilized. As a method for adding a small amount of a halogen element, sputtering is performed by introducing a gas containing a halogen element into the chamber. In the case where a gas containing a halogen element is introduced, the exhaust means of the chamber needs to be provided with an abatement system for removing harm. As for the concentration of the halogen element contained in the gate insulating film, the concentration peak obtained by analysis with a secondary ion mass spectrometer (SIMS) is preferably in the range of from $1 \times 10^{15}$ cm$^{-3}$ to $1 \times 10^{20}$ cm$^{-3}$ inclusive.

When the $SiO_x$ (x>0) film is formed, a sputtering method in which artificial quartz is used as a target and a rare gas, typically, argon is used, or a reactive sputtering method in which single crystal silicon is used as a target and chemically reacted with an oxygen gas to obtain a $SiO_x$ (x>0) film can be used. Here, artificial quartz is used as a target, and sputtering is performed under an atmosphere containing only oxygen or an atmosphere containing oxygen at greater than or equal to 90% and Ar at less than or equal to 10% so that as much oxygen as possible is contained in a $SiO_x$ (x>0) film. Thus, a $SiO_x$ (x>0) film containing excessive oxygen is formed.

After the $SiO_x$ (x>0) film is deposited, the gate valve 85 is opened, and the substrate is transferred to the transfer chamber 80 by the transfer robot 81 without being exposed to air. Then, the gate valve 86 is opened, the substrate is transferred to a third treatment chamber 91, and the gate valve 86 is closed.

In this embodiment, the third treatment chamber 91 is a sputtering chamber in which sputtering is performed using a DC magnetron sputtering method. In the third treatment chamber 91, an oxide semiconductor layer (IGZO film) is deposited as a semiconductor layer. The IGZO film can be deposited using an oxide semiconductor target containing In, Ga, and Zn, under a rare gas atmosphere or an oxygen atmosphere. Here, an oxide semiconductor containing In, Ga, and Zn is used as a target and sputtering is performed by a pulsed DC sputtering method under an atmosphere containing only oxygen or an atmosphere containing oxygen at greater than or equal to 90% and Ar at less than or equal to 10% so that as much oxygen as possible is contained in the IGZO film, whereby an IGZO film containing excessive oxygen is formed.

As described above, the $SiO_x$ (x>0) film containing excessive oxygen and the IGZO film containing excessive oxygen are deposited successively without being exposed to air, whereby an interface state between the films containing excessive oxygen can be stabilized, and the reliability of a TFT can be improved. If the substrate is exposed to air before deposition of the IGZO film, moisture or the like is attached and the interface state is adversely affected, which may cause phenomena such as variation in threshold voltage, deterioration in electric characteristics, and a normally-on TFT. Moisture is a hydrogen compound. When the films are successively deposited without being exposed to air, the hydrogen compound can be prevented from existing at the interface. Therefore, by successive film formation, variation in threshold voltage can be reduced, deterioration in electric characteristics can be prevented, or shift of TFT characteristics to the normally-on side can be reduced, desirably, the shift of the TFT characteristics can be prevented.

In addition, in the second treatment chamber 90 which is a sputtering chamber, both an artificial quartz target and an oxide semiconductor target containing In, Ga, and Zn are placed, and the films are successively deposited using a shutter; therefore, the films can be stacked in the same chamber. A shutter is provided between the target and the substrate; a shutter is opened for a target which is deposited, and a target which is not deposited is shielded by a shutter. Advantages of a process in which the films are stacked in the same chamber are the following points: reduction of the number of chambers which are used, and prevention of particles or the like attached to the substrate during transfer of the substrate between different chambers.

Next, the gate valve 86 is opened, and the substrate is transferred to the transfer chamber 80 by the transfer robot 81 without being exposed to air. Then, the gate valve 87 is opened, the substrate is transferred to a fourth treatment chamber 92, and the gate valve 87 is closed.

Here, the fourth treatment chamber 92 is a sputtering chamber employing an RF magnetron sputtering method. In the fourth treatment chamber 92, a silicon oxide film ($SiO_x$ film (x>0)) is formed as an insulating film to be a channel protective layer. As the channel protective layer, an aluminum oxide film (an $Al_2O_3$ film), a magnesium oxide film (a $MgO_x$ film (x>0)), an aluminum nitride film (an $AlN_x$ film (x>0)), an yttrium oxide film (an $YO_x$ film (x>0)), or the like can be used instead of the silicon oxide film.

Further, a small amount of a halogen element such as fluorine or chlorine may be added into the channel protective layer so that mobile ions of sodium or the like can be immobilized. As a method for adding a halogen element, sputtering is performed by introducing a gas containing a halogen element into a chamber. In the case of introducing a gas containing a halogen element, the exhaust means of the chamber needs to be provided with an abatement system for removing harm. As for the concentration of the halogen element contained in the channel protective layer, the concentration peak obtained by analysis with a secondary ion mass spectrometer (SIMS) is preferably in the range of from $1 \times 10^{15}$ cm$^{-3}$ to $1 \times 10^{20}$ cm$^{-3}$ inclusive.

When the $SiO_x$ (x>0) film is formed as the channel protective layer, a sputtering method in which artificial quartz is used as a target and a rare gas, typically, argon is used, or a reactive sputtering method in which silicon is used as a target and chemically reacted with an oxygen gas to obtain a $SiO_x$ (x>0) film can be used. Here, artificial quartz is used as a target, and sputtering is performed under an atmosphere containing only oxygen or an atmosphere containing oxygen at greater than or equal to 90% and Ar at less than or equal to 10% so that as much oxygen as possible is contained in a $SiO_x$ (x>0) film. Thus, a $SiO_x$ (x>0) film containing excessive oxygen is formed.

As described above, the $SiO_x$ (x>0) film containing excessive oxygen and the IGZO film containing excessive oxygen, and the channel protective layer containing excessive oxygen are deposited successively without being exposed to air. Since the three layers all contain excessive oxygen, the interface state of the films can be further stabilized, and the reliability of a TFT can be improved. If the substrate is exposed to air before or after deposition of the IGZO film, moisture or the like is attached and the interface state is adversely affected, which may cause phenomena such as variation in threshold voltage, deterioration in electric characteristics, and a normally-on TFT. Moisture is a hydrogen compound. When the films are successively deposited without being exposed to air, the hydrogen compound can be prevented from existing at the interface of the IGZO film. Therefore, by successive film formation of the three layers, variation in threshold voltage can be reduced, deterioration in electric characteristics can be prevented, or shift of TFT characteristics to the normally-on side can be reduced, desirably, the shift of the TFT characteristics can be prevented.

In addition, in the second treatment chamber 90 which is a sputtering chamber, both an artificial quartz target and an oxide semiconductor target containing In, Ga, and Zn are placed, and the three layers are successively deposited using a shutter; therefore, the films can be stacked in the same chamber. Advantages of a process in which the films are stacked in the same chamber are the following points: reduction of the number of chambers which are used, and prevention of particles or the like attached to the substrate during transfer of the substrate between different chambers.

After the above-described steps are repeated to perform a deposition process on a plurality of substrates in a cassette case, the vacuum cassette chamber is exposed to air, and the substrate and the cassette are taken out.

Next, to pattern the IGZO film, the channel protective layer is selectively etched and further the IGZO film is selectively etched. To form the pattern, dry etching or wet etching may be used or selective etching may be performed twice. In this stage, the surface of the gate insulating film is exposed in a region where the IGZO film is removed.

Next, the channel protective layer is etched so that only a portion thereof overlapping with the gate electrode, that is, only a portion thereof overlapping with a portion to be a channel formation region of the IGZO film is left. Here, the channel protective layer is etched under the condition that the etching rate is sufficiently different from that of the IGZO film. In the case where there is not a sufficient difference in etching rate between the channel protective layer and the IGZO film in etching the channel protective layer, the surface portion of the IGZO film is partially etched and thus the IGZO film has a region thinner than a region overlapped with the channel protective layer. Note that in the case where the channel protective layer is formed using the same material as the gate insulating film, the gate insulating film is also etched by the etching. Therefore, it is preferable to use a material different from that of the gate insulating film for the channel protective layer to prevent the gate insulating film from being etched. In this embodiment, the gate insulating film has a two-layer structure in which the upper layer is a $SiO_x$ film (x>0) and thus might be removed and the lower layer is a silicon nitride film and functions as an etching stopper.

Next, the substrate is set in the cassette chamber of the multi-chamber manufacturing apparatus illustrated in FIG. 9 again.

Next, after the cassette chamber is placed in a reduced pressure state, the substrate is transferred to the transfer chamber 80 with a transferring robot 81 by opening the gate valve 83 and transferred to a fifth treatment chamber 93 by opening a gate valve 88 without being exposed to air, and then the gate valve 88 is closed.

In this embodiment, the fifth treatment chamber 93 is a sputtering chamber in which sputtering is performed using a DC magnetron sputtering method. In the fifth treatment chamber 93, a buffer layer is deposited. In the fifth treatment chamber 93 which is a sputtering chamber, both a titanium target and an aluminum target are placed. The films are deposited to be stacked in the same chamber by successive film formation using a shutter. Here, an aluminum target is shielded by a shutter, and an oxygen gas is introduced and reactive sputtering is performed, whereby a titanium oxide ($TiO_x$ (x>0)) film is formed. This $TiO_x$ (x>0) film functions as a source region or a drain region. Next, an oxygen gas is exhausted from the fifth treatment chamber 93, an argon gas is introduced, and sputtering is performed, so that a titanium film is deposited. Then, a titanium target is shielded by a shutter, and an aluminum film is stacked over the titanium film. After that, the aluminum target is shielded by the shutter, and a titanium film is stacked over the aluminum film.

By thus successively forming a $TiO_x$ film (x>0) and a metal multilayer film without exposing them to air, a favorable interface state can be achieved and contact resistance can be reduced between the $TiO_x$ film (x>0) and the metal multilayer film.

After the above-described steps are repeated to perform a deposition process on a plurality of substrates in a cassette case, the vacuum cassette chamber is exposed to air, and the substrate and the cassette are taken out.

Next, the metal multilayer film is selectively etched to form the source and drain electrodes. Further, the $TiO_x$ film (x>0) is selectively etched using the source and drain electrodes as masks, so that source and drain regions are formed. In the etching of the $TiO_x$ film (x>0), the channel protective layer functions as an etching stopper.

Through the above steps, the inverted-staggered thin film transistor including the channel protective layer can be formed.

Although an example is described in which the $TiO_x$ film (x>0) and the metal multilayer film are formed in the same chamber through the above steps, the present invention is not particularly limited to this. Alternatively, the $TiO_x$ film (x>0) and the metal multilayer film may be formed in different chambers.

In this embodiment, a multi-chamber manufacturing apparatus is shown as an example, but an in-line manufacturing apparatus in which sputtering chambers are connected in series may be used and successive film formation may be performed without exposing films to air.

The apparatus illustrated in FIG. 9 has a so-called face-down treatment chamber in which the deposition target surface of the substrate faces downward, but may also have a vertical placement treatment chamber in which a substrate is placed vertically. The vertical placement treatment chamber has an advantage that a footprint is smaller than that of a face-down treatment chamber and can be effectively used in the case where a large-area substrate which could be bent due to its weight is used.

This embodiment can be implemented in combination with any of other embodiments as appropriate.

Embodiment 7

In Embodiment 4, an example in which at least a part of a driver circuit and a thin film transistor to be disposed in a pixel portion are formed over one substrate will be described.

The thin film transistor to be disposed in the pixel portion is formed according to any one of Embodiments 1 to 5. Further, the thin film transistor described in any one of Embodiments 1 to 5 is an n-channel TFT, and thus a part of a driver circuit that can include an n-channel TFT among driver circuits is formed over the same substrate as the thin film transistor of the pixel portion.

Figure 10A:
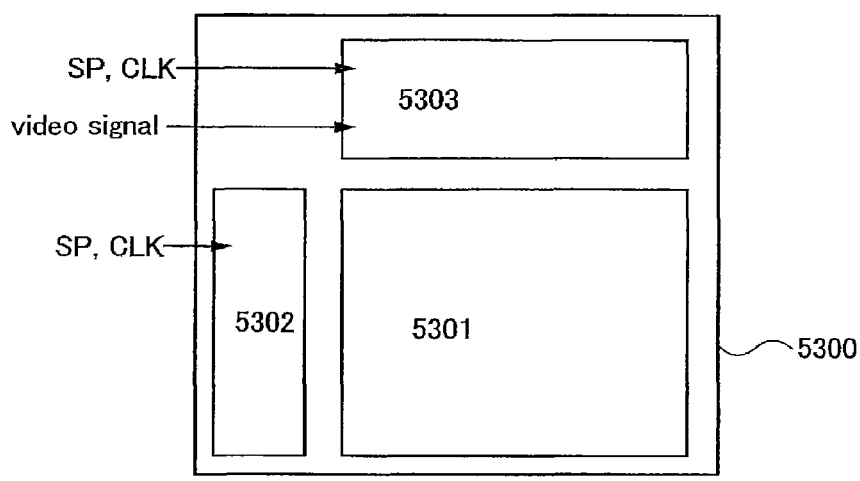
FIGS. 10A and 10B are block diagrams each illustrating a display device.

FIG. 10A illustrates an example of a block diagram of an active-matrix liquid crystal display device. The display device illustrated in FIG. 10A includes, over a substrate 5300, a pixel portion 5301 including a plurality of pixels that are provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

In addition, the thin film transistor described in any one of Embodiments 1 to 5 is an n-channel TFT, and a signal line driver circuit including the n-channel TFT will be described with reference to FIG. 11.

Figure 11:
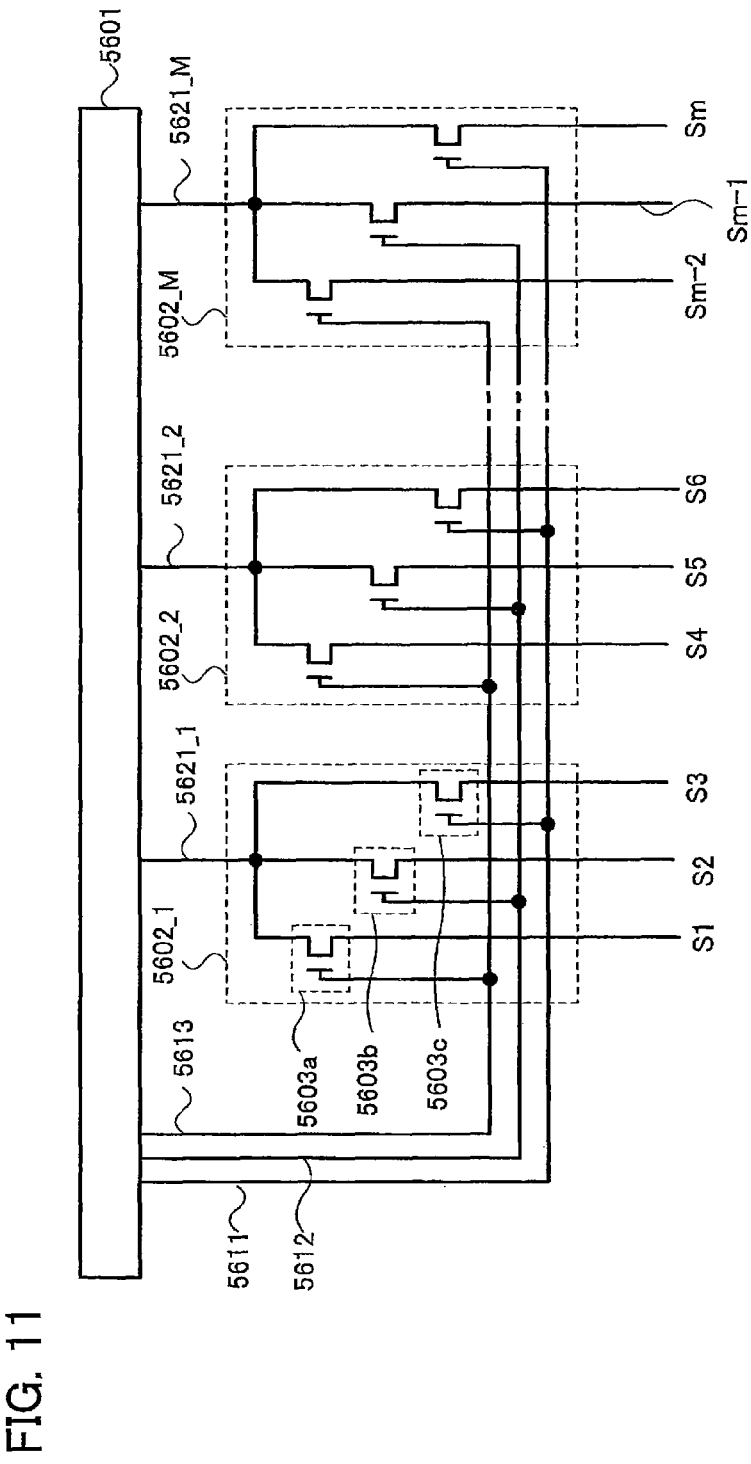
FIG. 11 is a diagram illustrating a structure of a signal line driver circuit.

The signal line driver circuit illustrated in FIG. 11 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603*a*, a second thin film transistor 5603*b*, and a third thin film transistor 5603*c*.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the switch groups 5602_1 to 5602_M are connected to the wirings 5621_1 to 5621_M, respectively. Each of the wirings 5621_1 to 5621_M is connected to three signal lines via the first thin film transistor 5603*a*, the second thin film transistor 5603*b*, and the third thin film transistor 5603*c*. For example, the wiring 5621_J of the J-th column (one of the wirings 5621_1 to 5621_M) is connected to a signal line Sj−1, a signal line Sj, and a signal line Sj+1 via the first thin film transistor 5603*a*, the second thin film transistor 5603*b*, and the third thin film transistor 5603*c* included in the switch group 5602_J.

A signal is input to each of the first wiring 5611, the second wiring 5612, and the third wiring 5613.

Note that the driver IC 5601 is preferably formed over a single crystal substrate. The switch groups 5602_1 to 5602_M are preferably formed over the same substrate as the pixel portion illustrated in any one of Embodiments 1 to 5. Therefore, the driver IC 5601 and the switch groups 5602_1 to 5602_M are preferably connected through an FPC or the like.

Figure 12:
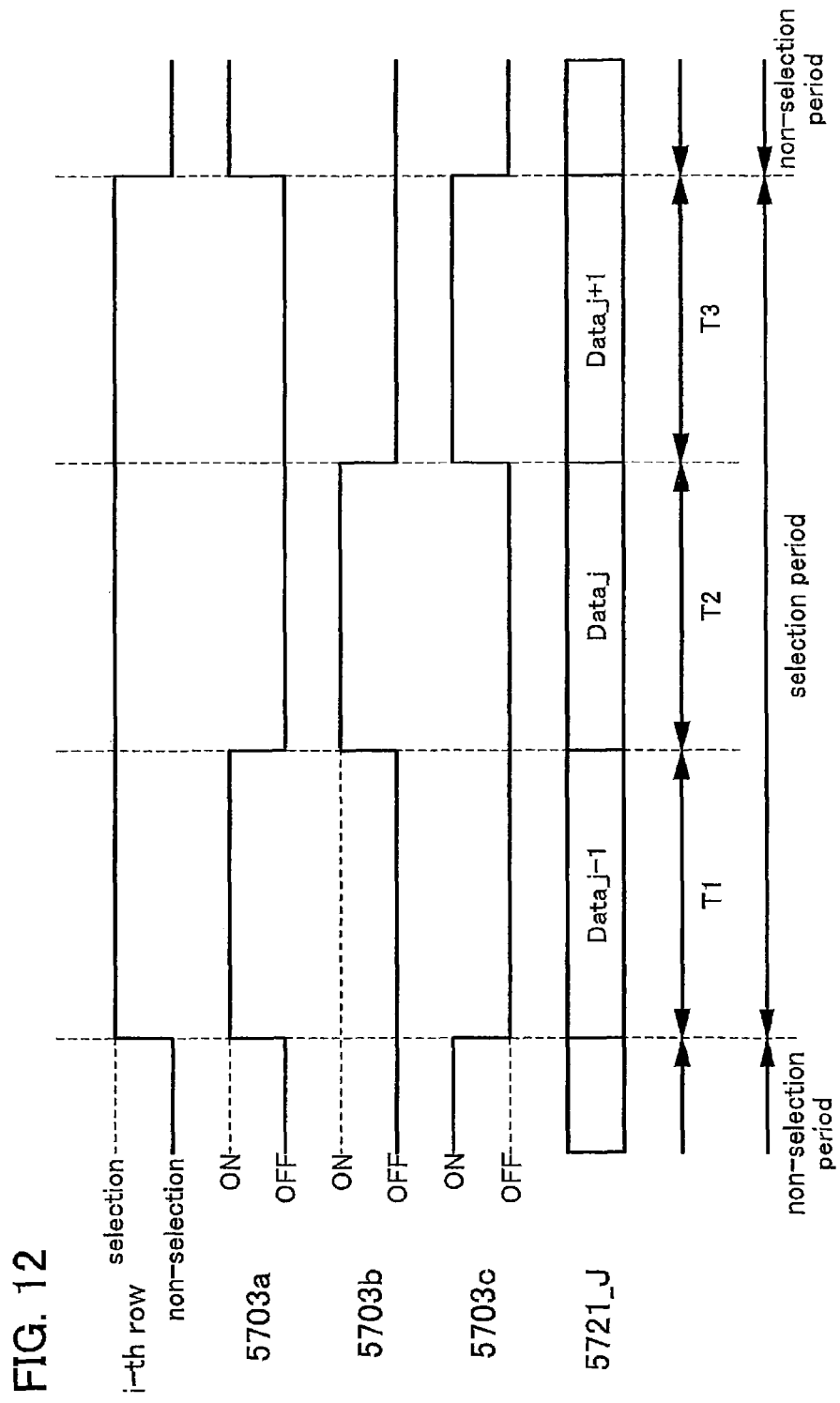
FIG. 12 is a timing chart showing operation of a signal line driver circuit.

Next, operation of the signal line driver circuit illustrated in FIG. 11 will be described with reference to a timing chart in FIG. 12. The timing chart in FIG. 12 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 11 operates in a similar manner to that of FIG. 12 even when a scan line of another row is selected.

Note that the timing chart in FIG. 12 shows a case where the wiring 5621_J in the J-th column is connected to the signal line Sj−1, the signal line Sj, and the signal line Sj+1 via the first thin film transistor 5603*a*, the second thin film transistor 5603*b*, and the third thin film transistor 5603*c*.

The timing chart in FIG. 12 shows timing at which the scan line Gi of the i-th row is selected, timing 5703*a* of on/off of the first thin film transistor 5603*a*, timing 5703*b* of on/off of the second thin film transistor 5603*b*, timing 5703*c* of on/off of the third thin film transistor 5603*c*, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, in the first sub-selection period T1, the second sub-selection period T2, and the third sub-selection period T3, the video signals input to the wiring 5621_J are denoted by Data_j−1, Data_j, and Data_j+1.

As illustrated in FIG. 12, in the first sub-selection period T1, the first thin film transistor 5603*a* is turned on, and the second thin film transistor 5603*b* and the third thin film transistor 5603*c* are turned off. At this time, Data_j−1 input to the wiring 5621_J is input to the signal line Sj−1 via the first thin film transistor 5603*a*. In the second sub-selection period T2, the second thin film transistor 5603*b* is turned on, and the first thin film transistor 5603*a* and the third thin film transistor 5603*c* are turned off. At this time, Data_j input to the wiring 5621_J is input to the signal line Sj via the second thin film transistor 5603*b*. In the third sub-selection period T3, the third thin film transistor 5603*c* is turned on, and the first thin film transistor 5603*a* and the second thin film transistor 5603*b* are turned off. At this time, Data_j+1 input to the wiring 5621_J is input to the signal line Sj+1 via the third thin film transistor 5603*c*.

As described above, in the signal line driver circuit in FIG. 11, by dividing one gate selection period into three, video signals can be input to three signal lines from one wiring 5621 in one gate selection period. Therefore, in the signal line driver circuit in FIG. 11, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 11 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in respective sub-selection periods as illustrated in FIG. 11.

For example, when video signals are input to three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 13:
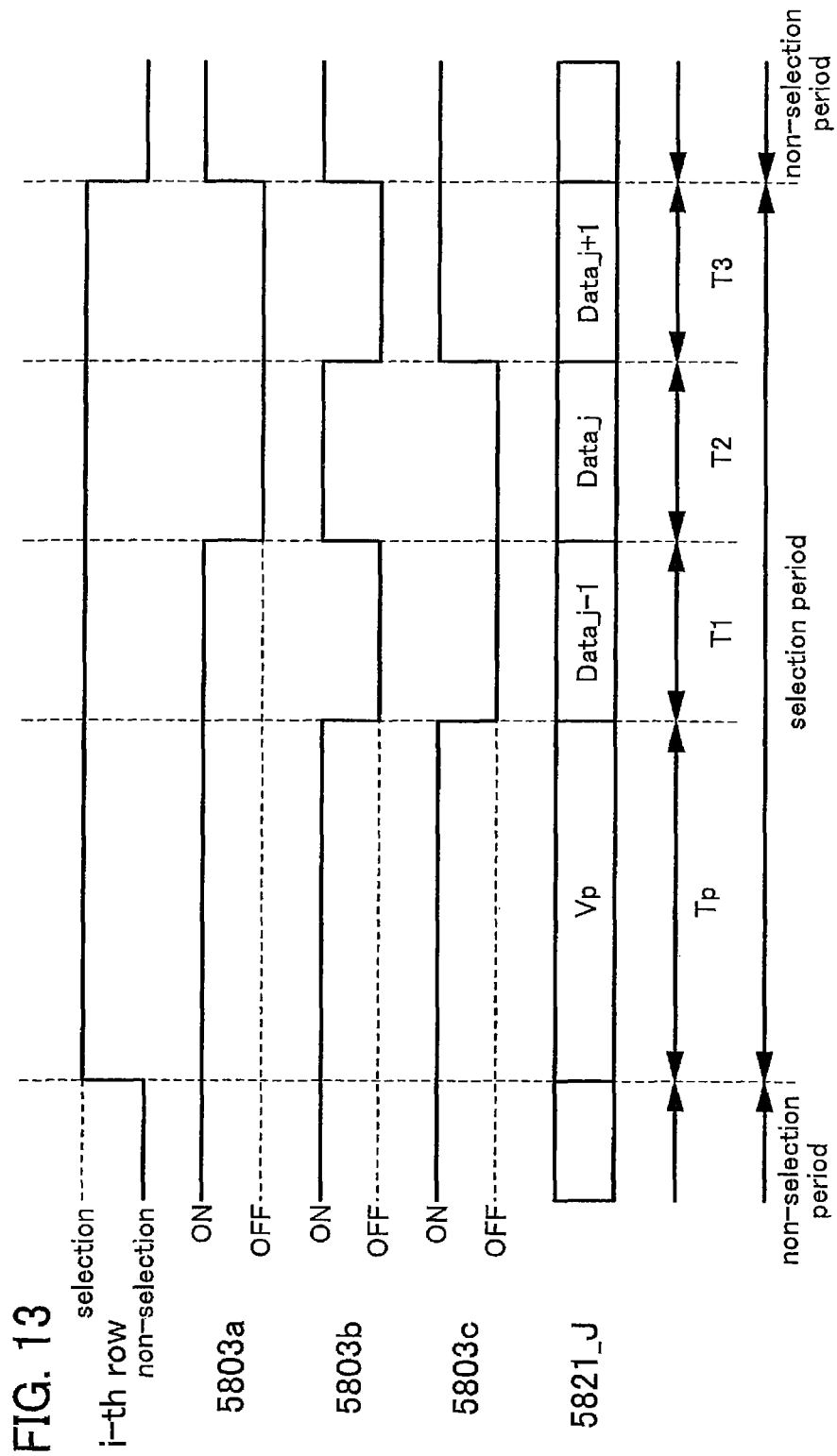
FIG. 13 is a timing chart showing operation of a signal line driver circuit.

As another example, one selection period may be divided into a precharge period Tp, the first sub-selection period T1, the second sub-selection period T2, and the third sub-selection period T3 as illustrated in a timing chart in FIG. 13. The timing chart in FIG. 13 illustrates timing at which the scan line Gi of the i-th row is selected, timing 5803*a* of on/off of the first thin film transistor 5603*a*, timing 5803*b* of on/off of the second thin film transistor 5603*b*, timing 5803*c* of on/off of the third thin film transistor 5603*c*, and a signal 5821_J input to the wiring 5621_J of the J-th column. As illustrated in FIG. 13, the first thin film transistor 5603*a*, the second thin film transistor 5603*b*, and the third thin film transistor 5603*c* are tuned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 11 to which the timing chart in FIG. 13 is applied, the video signal can be written to the pixel at high speed because the signal line can be precharged by providing a precharge selection period before a sub-selection period. Note that portions in FIG. 13 which are similar to those of FIG. 12 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is produced. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large current can be used.

One mode of a shift register which is used for a part of a scan line driver circuit will be described with reference to FIG. 14 and FIG. 15.

Figure 14:
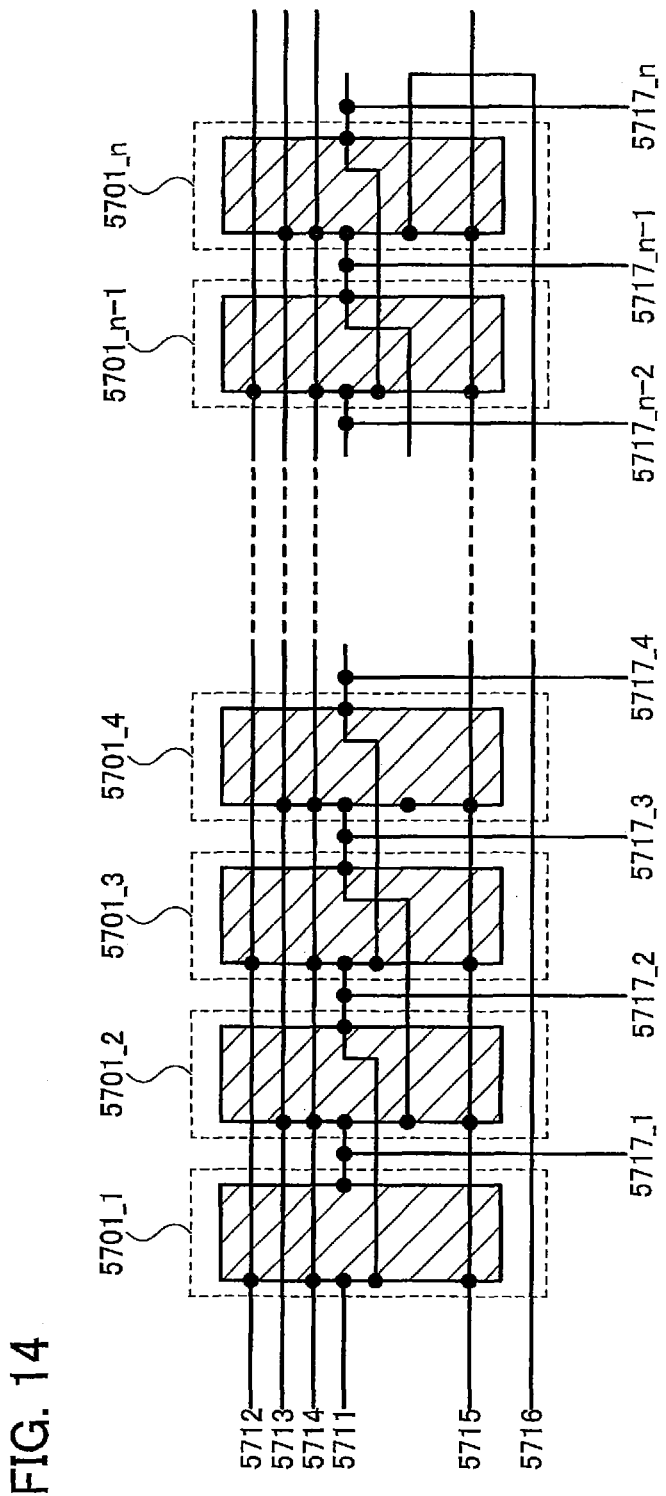
FIG. 14 is a diagram illustrating a structure of a shift register.

FIG. 14 illustrates a circuit configuration of the shift register. The shift register illustrated in FIG. 14 includes a plurality of flip-flops (flip-flops 5701_1 to 5701_n). The shift register is operated with input of a first clock signal, a second clock signal, a start pulse signal, and a reset signal.

Connection relations of the shift register in FIG. 14 will be described. In the i-th stage flip-flop 5701_i (one of the flip-flops 5701_1 to 5701_n) in the shift register of FIG. 14, a first wiring 5501 illustrated in FIG. 15 is connected to a seventh wiring 5717_i−1; a second wiring 5502 illustrated in FIG. 15 is connected to a seventh wiring 5717_i+1; a third wiring 5503 illustrated in FIG. 15 is connected to a seventh wiring 5717_i; and a sixth wiring 5506 illustrated in FIG. 15 is connected to a fifth wiring 5715.

Figure 15:
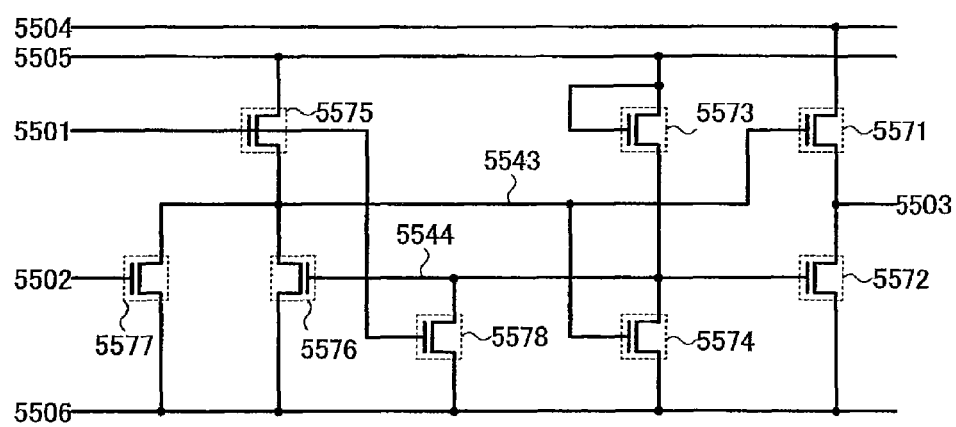
FIG. 15 is a diagram illustrating a connecting structure of flip-flops illustrated in FIG. 14.

Further, a fourth wiring 5504 illustrated in FIG. 15 is connected to a second wiring 5712 in flip-flops of odd-numbered stages, and is connected to a third wiring 5713 in flip-flops of even-numbered stages. A fifth wiring 5505 illustrated in FIG. 15 is connected to a fourth wiring 5714.

Note that the first wiring 5501 of the first stage flip-flop 5701_1 illustrated in FIG. 15 is connected to a first wiring 5711. Moreover, the second wiring 5502 of the n-th stage flip-flop 5701_n illustrated in FIG. 15 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 14 illustrates details of the flip-flop illustrated in FIG. 14. A flip-flop illustrated in FIG. 15 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flop illustrated in FIG. 14 will be described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505 and a second electrode of the third thin film transistor is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to a gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the points at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected are each referred to as a node 5543. The points at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected are each referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in any one of Embodiments 1 to 5. The n-channel TFT described in any one of Embodiments 1 to 5 has a high mobility, and thus a driving frequency of a driver circuit can be increased. In addition, in the n-channel TFT illustrated in any of Embodiments 1 to 5, since parasitic capacitance is reduced by the buffer layer, the frequency characteristics (f characteristics) are high. For example, a scan line driver circuit using the n-channel TFT described in any one of Embodiments 1 to 5 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized.

Figure 10B:
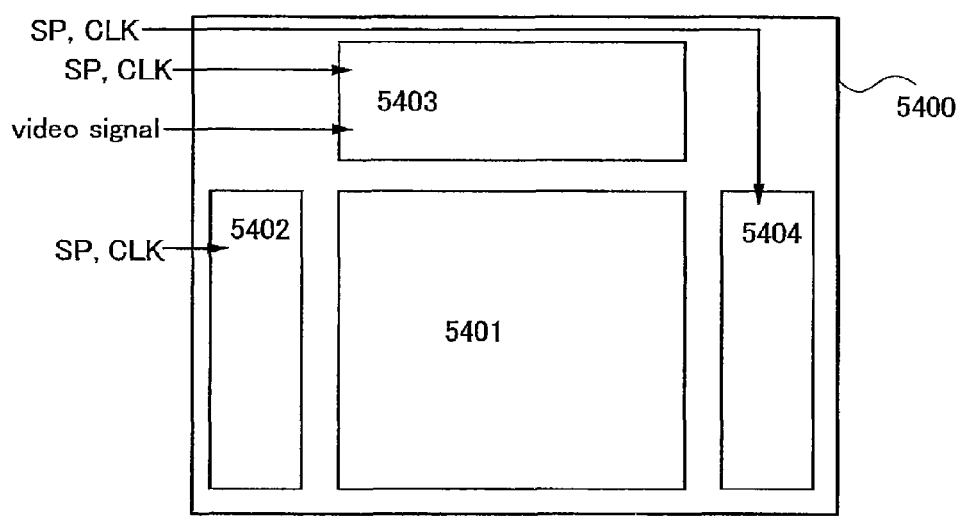

Further, when an active-matrix light-emitting display device is manufactured, a plurality of transistors are arranged in at least one pixel, and thus a plurality of scan line driver circuits are preferably arranged. FIG. 10B is a block diagram illustrating an example of an active-matrix light-emitting display device.

The display device illustrated in FIG. 10B includes, over a substrate 5400, a pixel portion 5401 having a plurality of pixels provided with a display element, a first scan line driver circuit 5402 and a second scan line driver circuit 5404 that select a pixel, and a signal line driver circuit 5403 that controls input of a video signal to the selected pixel.

When the video signal input to a pixel of the display device illustrated in FIG. 10B is a digital signal, a pixel emits light or does not emit light by switching of ON/Off of a transistor. Thus, grayscale can be displayed using an area ratio grayscale method or a time ratio grayscale method. An area ratio grayscale method refers to a driving method by which one pixel is divided into a plurality of subpixels and the respective subpixels are driven independently based on video signals so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than the liquid-crystal display elements. Specifically, in the case of displaying with a time gray scale method, one frame period is divided into a plurality of subframe periods. Then, in accordance with video signals, the light-emitting element in the pixel is set in a light-emitting state or a non-light-emitting state in each subframe period. By dividing one frame into a plurality of subframes, the total length of time, in which pixels actually emit light in one frame period, can be controlled with video signals so that gray scales are displayed.

In the example of the light-emitting device illustrated in FIG. 10B, in a case where two TFTs of a switching TFT and a current control TFT are arranged in one pixel, the first scan line driver circuit 5402 generates a signal which is input to a first scan line serving as a gate wiring of the switching TFT, and the second scan line driver circuit 5404 generates a signal which is input to a second scan line serving as a gate wiring of the current control TFT; however, one scan line driver circuit may generate both the signal which is input to the first scan line and the signal which is input to the second scan line. In addition, for example, there is a possibility that a plurality of the first scan lines used for controlling the operation of the switching element are provided in each pixel, depending on the number of transistors included in the switching element. In that case, one scan line driver circuit may generate all signals that are input to the plurality of first scan lines, or a plurality of scan line driver circuits may generate signals that are input to the plurality of first scan lines.

In addition, also in the light-emitting device, a part of the driver circuit(s) that can include n-channel TFTs among driver circuits can be formed over the same substrate as the thin film transistors of the pixel portions. Alternatively, the signal line driver circuit and the scan line driver circuit can be formed using only the n-channel TFTs described in Embodiments 1 to 5.

Moreover, the above-described driver circuit can be used for electronic paper that drives electronic ink using an element electrically connected to a switching element, without being limited to applications to a liquid crystal display device or a light-emitting device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positive-charged and second particles which are negative-charged. By applying an electric field to the microcapsules, the particles in the microcapsules are moved in opposite directions to each other and only the color of the particles concentrated on one side is exhibited. It is to be noted that the first particles and the second particles each contain pigment and do not move without an electric field. Moreover, the colors of the first particles and the second particles are different from each other (the colors include colorless or achroma).

In this way, an electrophoretic display is a display that utilizes a so-called dielectrophoretic effect by which a substance that has a high dielectric constant moves to a high-electric field region. An electrophoretic display does not need to use a polarizer and a counter substrate, which are required in a liquid crystal display device, and both the thickness and weight of the electrophoretic display device can be a half of those of a liquid crystal display device.

A solution in which the aforementioned microcapsules are dispersed throughout a solvent is referred to as electronic ink.

This electronic ink can be printed on a surface of glass, plastic, cloth, paper, or the like. Furthermore, by use of a color filter or particles that have a pigment, color display is possible, as well.

In addition, if a plurality of the aforementioned microcapsules are arranged as appropriate over an active-matrix substrate so as to be interposed between two electrodes, an active-matrix display device can be completed, and display can be performed by application of an electric field to the microcapsules. For example, any of Embodiments 1 to 5 can be applied.

It is to be noted that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

This embodiment can be implemented in combination with any of other embodiments as appropriate.

Embodiment 8

A thin film transistor of one embodiment of the present invention is manufactured, and a semiconductor device having a display function (also referred to as a display device) can be manufactured using the thin film transistor for a pixel portion and further for a driver circuit. Further, part or whole of a driver circuit can be formed over the same substrate as a pixel portion, using a thin film transistor of one embodiment of the present invention, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC including a controller or the like is mounted on the panel. An embodiment of the present invention relates to one mode of an element substrate before the display element is completed in a manufacturing process of the display device, and the element substrate is provided with means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, a liquid crystal display device will be described as an example of a semiconductor device of one embodiment of the present invention.

Figure 16A:
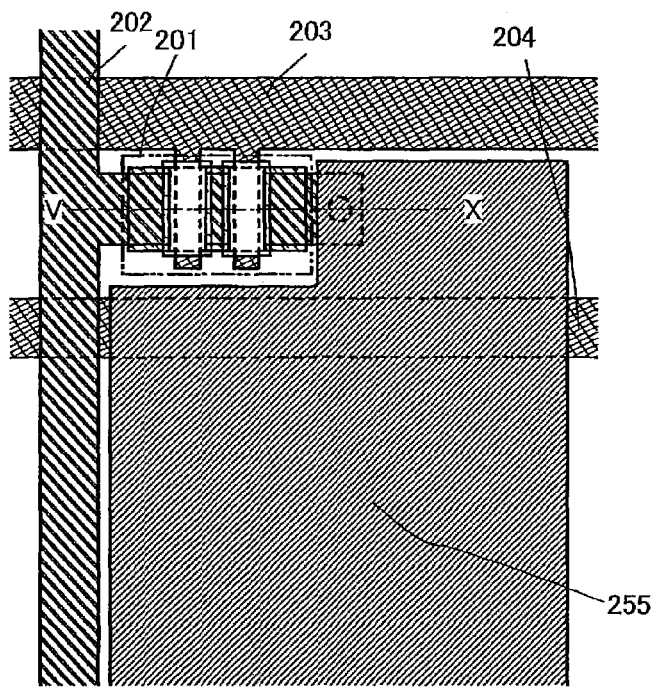
FIGS. 16A and 16B are views illustrating a liquid crystal display device to which an embodiment of the present invention is applied.
Figure 16B:
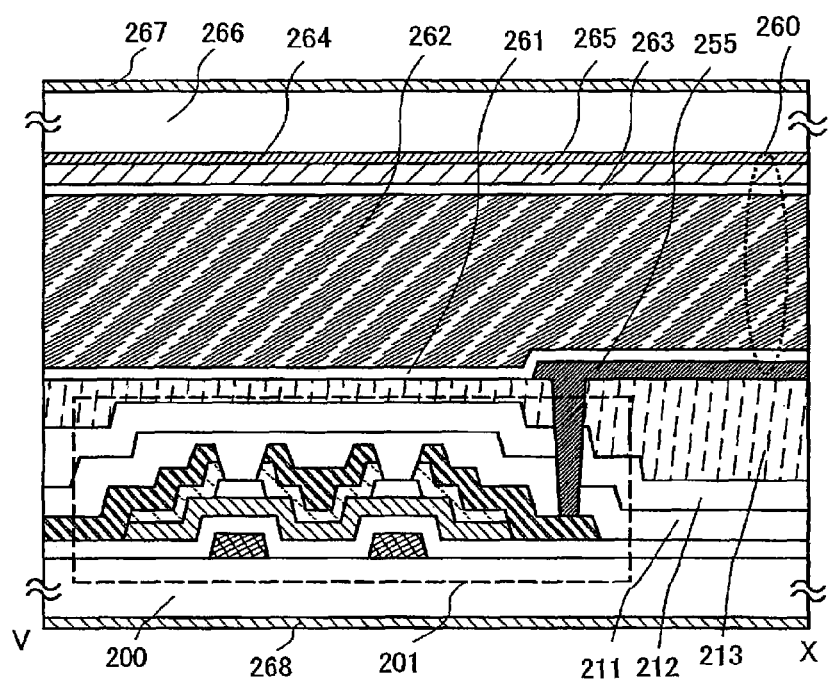

FIGS. 16A and 16B illustrate an active-matrix liquid crystal display device to which one embodiment of the present invention is applied. FIG. 16A is a plan view of the liquid crystal display device. FIG. 16B is a cross-sectional view taken along line V-X of FIG. 16A. A thin film transistor 201 used in the semiconductor device can be manufactured in a manner similar to the thin film transistor described in Embodiment 4 and is a highly reliable thin film transistor having an IGZO semiconductor layer and a buffer layer including metal oxide. Any of the thin film transistors described in Embodiments 1, 3, and 5 can also be used as the thin film transistor 201 of this embodiment.

The liquid crystal display device of this embodiment illustrated in FIG. 16A includes a source wiring layer 202, an inverted staggered thin film transistor 201 with a multi-gate structure, a gate wiring layer 203, and a capacitor wiring layer 204.

Further, in FIG. 16B, in the liquid crystal display device of this embodiment, a substrate 200 provided with the thin film transistor 201 with a multi-gate structure, an insulating layer 211, an insulating layer 212, an insulating layer 213, an electrode layer 255 used for a display element, an insulating layer 261 serving as an alignment film, and a polarizing plate 268 and a substrate 266 provided with an insulating layer 263 serving as an alignment film, an electrode layer 265 used for a display element, a coloring layer 264 serving as a color filter, and a polarizing plate 267 face to each other with a liquid crystal layer 262 interposed therebetween; thus, a liquid crystal display element 260 is formed.

Although FIGS. 16A and 16B illustrate an example of a transmissive liquid crystal display device, an embodiment of the present invention can also be applied to a reflective liquid crystal display device and a transflective liquid crystal display device.

While FIGS. 16A and 16B illustrate an example of the liquid crystal display device in which the polarizing plate 267 is provided in a position outer than the substrate 266 (on the viewer side) and the coloring layer 264 and the electrode layer 265 used for a display element are provided in a position inner than the substrate 266 in that order, the polarizing plate 267 may be provided in an inner position than the substrate 266. The stacked structure of the polarizing plate and the coloring layer is not limited to that shown in FIG. 16B and may be set as appropriate depending on materials of the polarizing plate and the coloring layer or conditions of manufacturing steps. Further, a light-blocking film serving as a black matrix may be provided.

The electrode layers 255 and 265 each serving as a pixel electrode layer can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

A conductive composition including a conductive high molecule (also referred to as a conductive polymer) can be used for the electrode layers 255 and 265. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 $\Omega \cdot cm$.

As the conductive high molecule, a so-called π-electron conjugated conductive polymer can be used. For example, polyaniline or a derivative thereof, polypyrrole or a derivative thereof, polythiophene or a derivative thereof, a copolymer of more than two kinds of them, and the like can be given.

Through this process, a highly reliable liquid crystal display device as a semiconductor device can be manufactured.

This embodiment can be combined with the structure described in other embodiments, as appropriate.

Embodiment 9

In this embodiment, an example of electronic paper will be described as a semiconductor device according to an embodiment of the present invention.

Figure 23:
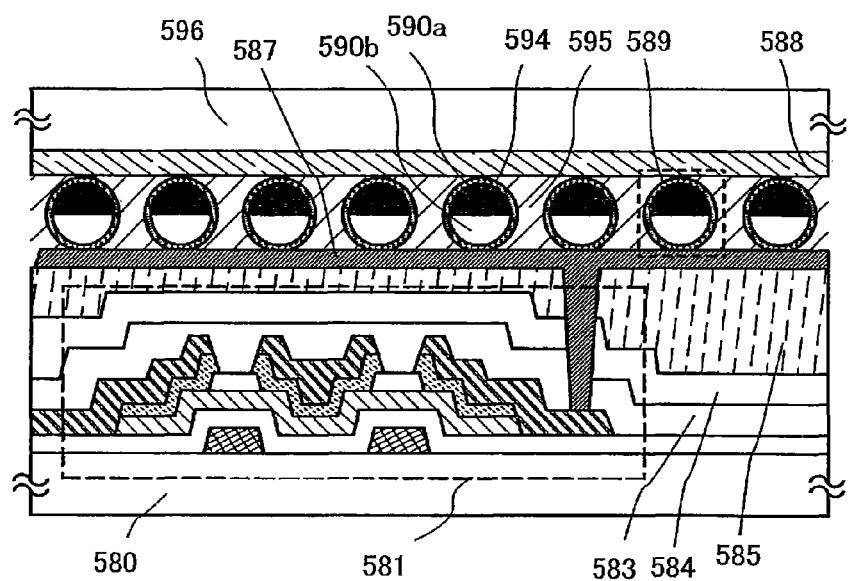
FIG. 23 is a view illustrating electronic paper to which an embodiment of the present invention is applied.

FIG. 23 illustrates active matrix electronic paper as an example of a semiconductor device to which an embodiment of the present invention is applied. A thin film transistor 581 used for the semiconductor device can be manufactured in a manner similar to the thin film transistor described in Embodiment 4 and is a highly reliable thin film transistor having an IGZO semiconductor layer and a buffer layer including metal oxide. Any of the thin film transistors described in Embodiments 1, 3, and 5 can also be used as the thin film transistor 581 of this embodiment.

The electronic paper in FIG. 23 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is an inverted staggered thin film transistor with a multi-gate structure, and a source electrode and a drain electrode thereof is in contact with a first electrode layer 587 at an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 23).

In FIG. 23, an electrode layer containing a light-transmitting conductive high molecule is used as the first electrode layer. An inorganic insulating film is provided over the first electrode layer 587. The inorganic insulating film serves as a barrier film which prevents ionic impurities from diffusing from the first electrode layer 587.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper as a semiconductor device can be manufactured.

This embodiment can be combined with the structure described in other embodiments, as appropriate.

Embodiment 10

In this embodiment, an example of a light-emitting display device will be described as a semiconductor device according an embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 19A:
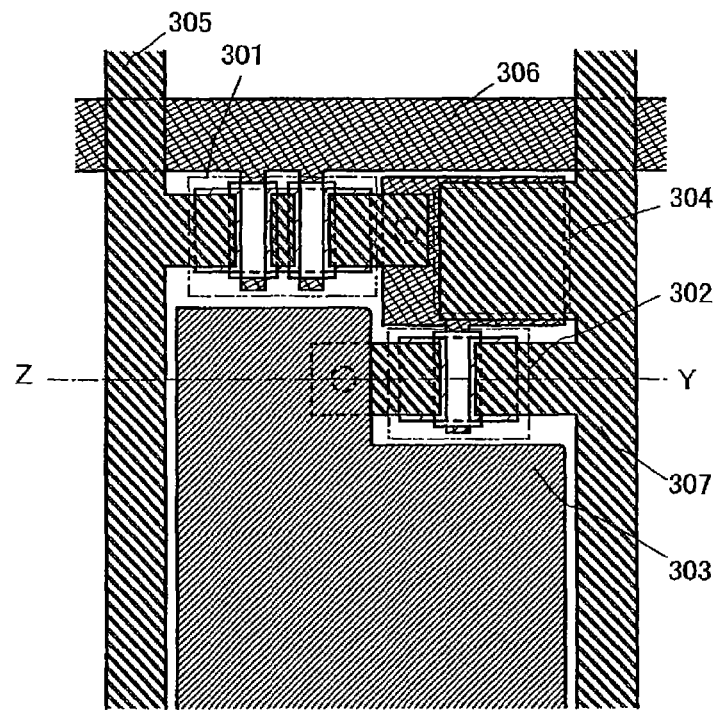
FIGS. 19A and 19B are views illustrating a light-emitting display device to which an embodiment of the present invention is applied.
Figure 19B:
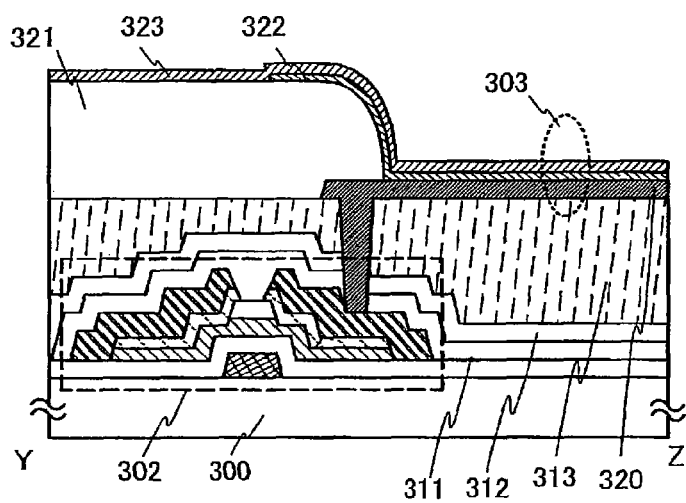
Figure 20:
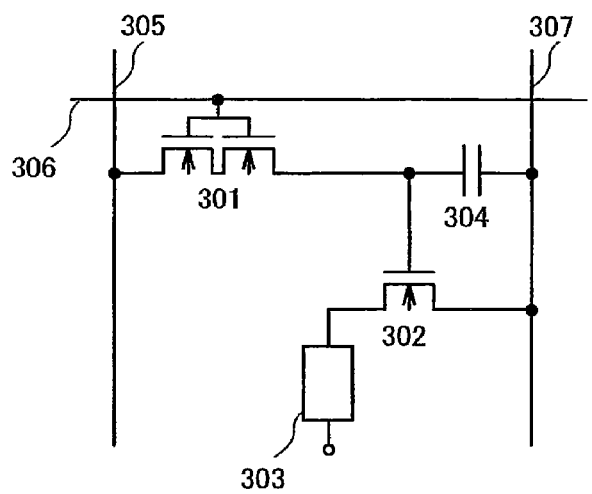
FIG. 20 is a diagram illustrating a light-emitting display device to which an embodiment of the present invention is applied.

FIGS. 19A and 19B illustrate an active-matrix light-emitting display device as an example of a semiconductor device to which an embodiment of the present invention is applied. FIG. 19A is a plan view of the light-emitting display device, and FIG. 19B is a cross-sectional view taken along line Y-Z of FIG. 19A. FIG. 20 shows an equivalent circuit of the light-emitting display device illustrated in FIGS. 19A and 19B.

Thin film transistors 301 and 302 used for a semiconductor device can be manufactured in a manner similar to any of the thin film transistors described in Embodiments 1 and 2 and are highly reliable thin film transistors each having an IGZO semiconductor layer and a buffer layer including metal oxide and having n-type conductivity. The thin film transistors described in Embodiments 3 to 5 can also be used as the thin film transistors 301 and 302 of this embodiment.

The light-emitting display device of this embodiment illustrated in FIG. 19A and FIG. 20 includes a thin film transistor 301 with a multi-gate structure, a thin film transistor 302 a capacitor element 304, a source wiring layer 305, a gate wiring layer 306, and a light-emitting element 303. The thin film transistors 301 and 302 are n-channel thin film transistors.

In FIG. 19B, the light-emitting display device of this embodiment includes the thin film transistor 302; an insulating layer 311; an insulating layer 312; an insulating layer 313; a partition wall 321; and a first electrode layer 320, an electroluminescent layer 322, and a second electrode layer 323 which are used for the light-emitting element 303.

The insulating layer 313 is preferably formed using an organic resin such as acrylic, polyimide, or polyamide or using siloxane.

Since the thin film transistor 302 in the pixel is n-type in this embodiment, the first electrode layer 320 which is a pixel electrode layer is desirably a cathode. Specifically, for the cathode, a material with a low work function such as Ca, Al, CaF, MgAg, or AlLi can be used.

The partition wall 321 is formed using an organic resin film, an inorganic insulating film, or organic polysiloxane. It is particularly preferable that the partition wall 321 be formed using a photosensitive material and an opening be formed over the first electrode layer 320 so that a sidewall of the opening is formed as an inclined surface with continuous curvature.

The electroluminescent layer 322 may be formed using a single layer or a plurality of layers stacked.

The second electrode layer 323 as an anode is formed to cover the electroluminescent layer 322. The second electrode layer 323 can be formed using a light-transmitting conductive film using any of the light-transmitting conductive materials listed in Embodiment 8 for the pixel electrode layer. The second electrode layer 323 may also be formed using a titanium nitride film or a titanium film instead of the above-described light-transmitting conductive film. The light-emitting element 303 is formed by overlapping of the first electrode layer 320, the electroluminescent layer 322, and the second electrode layer 323. After that, a protective film may be formed over the second electrode layer 323 and the partition wall 321 in order to prevent entry of oxygen, hydrogen, moisture, carbon dioxide, or the like into the light-emitting element 303. As the protective film, a silicon nitride film, a silicon nitride oxide film, a DLC film, or the like can be formed.

Further, in a practical case, it is preferable that a display device completed to the state illustrated in FIG. 19B be packaged (sealed) with a protective film (such as a laminate film or an ultraviolet curable resin film) or a cover material with high air-tightness and little degasification so that the display device is not exposed to the outside air.

Next, structures of the light-emitting element will be described with reference to FIGS. 21A to 21C. A cross-sectional structure of a pixel will be described by taking an n-channel driving TFT as an example. Driving TFTs 7001, 7011, and 7021 used for semiconductor devices illustrated in FIGS. 21A to 21C can be manufactured in a manner similar to the thin film transistor described in Embodiment 1 and are highly reliable thin film transistors each having an IGZO semiconductor layer and a buffer layer including metal oxide. Alternatively, any of the thin film transistors described in Embodiments 2 to 5 can be employed as the driving TFTs 7001, 7011, and 7021.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure according to an embodiment of the present invention can be applied to a light-emitting element having any of these emission structures.

A light-emitting element having a top emission structure will be described with reference to FIG. 21A.

Figure 21A:
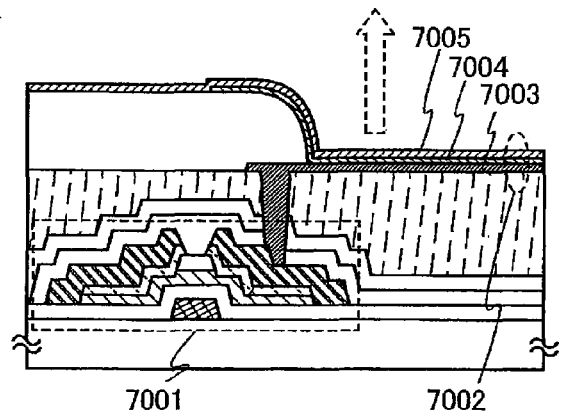
FIGS. 21A to 21C are views each illustrating a light-emitting display device to which an embodiment of the present invention is applied.

FIG. 21A is a cross-sectional view of a pixel in the case where the driving TFT 7001 is of an n-type and light is emitted from a light-emitting element 7002 to an anode 7005 side. In FIG. 21A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 21A, light is emitted from the light-emitting element 7002 to the anode 7005 side as indicated by an arrow.

Next, a light-emitting element having a bottom emission structure will be described with reference to FIG. 21B. FIG. 21B is a cross-sectional view of a pixel in the case where the driving TFT 7011 is of an n-type and light is emitted from a light-emitting element 7012 to a cathode 7013 side. In FIG. 21B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used as in the case of FIG. 21A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 21A, the light-emitting layer 7014 may be formed using either a single layer or a plurality of layers stacked. The anode 7015 is not required to transmit light, but can be formed using a light-transmitting conductive material as in the case of FIG. 21A. As the light-blocking film 7016, a metal or the like that reflects light can be used for example; however, it is not limited to a metal film. For example, a resin or the like to which black pigments are added can also be used.

The light-emitting element 7012 corresponds to a region where the cathode 7013 and the anode 7015 sandwich the light-emitting layer 7014. In the case of the pixel illustrated in FIG. 21B, light is emitted from the light-emitting element 7012 to the cathode 7013 side as indicated by an arrow.

Next, a light-emitting element having a dual emission structure will be described with reference to FIG. 21C. In FIG. 21C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 21A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 21A, the light-emitting layer 7024 may be formed using either a single layer or a plurality of layers stacked. The anode 7025 can be formed using a light-transmitting conductive material as in the case of FIG. 21A.

The light-emitting element 7022 corresponds to a region where the cathode 7023, the light-emitting layer 7024, and the anode 7025 overlap with one another. In the case of the pixel illustrated in FIG. 21C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 21B:
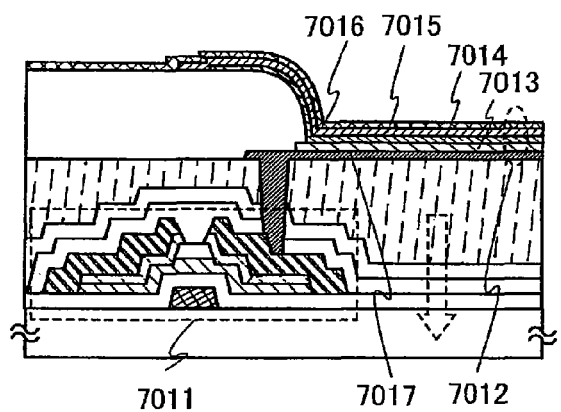
Figure 21C:
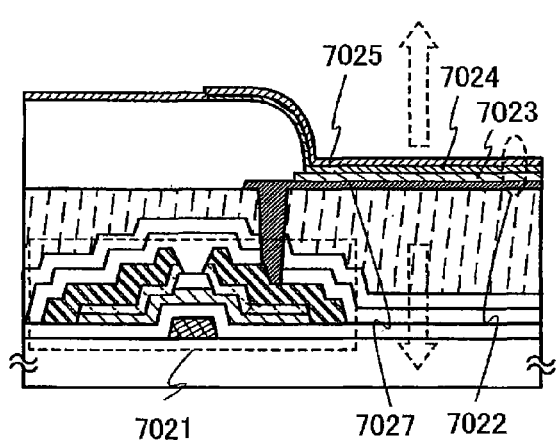

A semiconductor device described in this embodiment is not limited to the structures illustrated in FIGS. 21A to 21C and can be modified in various ways based on the spirit of techniques according to the present invention.

Through this process, a highly reliable light-emitting display device as a semiconductor device can be manufactured.

This embodiment can be combined with the structure described in other embodiments, as appropriate.

Embodiment 11

Next, a structure of a display panel, which is an embodiment of the semiconductor device of the present invention, will be described below. In this embodiment, a liquid crystal display panel (also referred to as a liquid crystal panel), which is one embodiment of a liquid crystal display device having a liquid crystal element as a display element, and a light-emitting display panel (also referred to as a light-emitting panel), which is one embodiment of a semiconductor device having a light-emitting element as a display element, will be described.

Figure 22A:
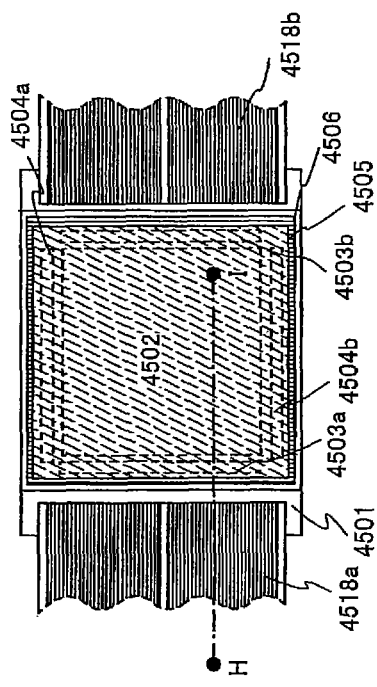
FIGS. 22A and 22B are views illustrating a light-emitting display device to which an embodiment of the present invention is applied.
Figure 22B:
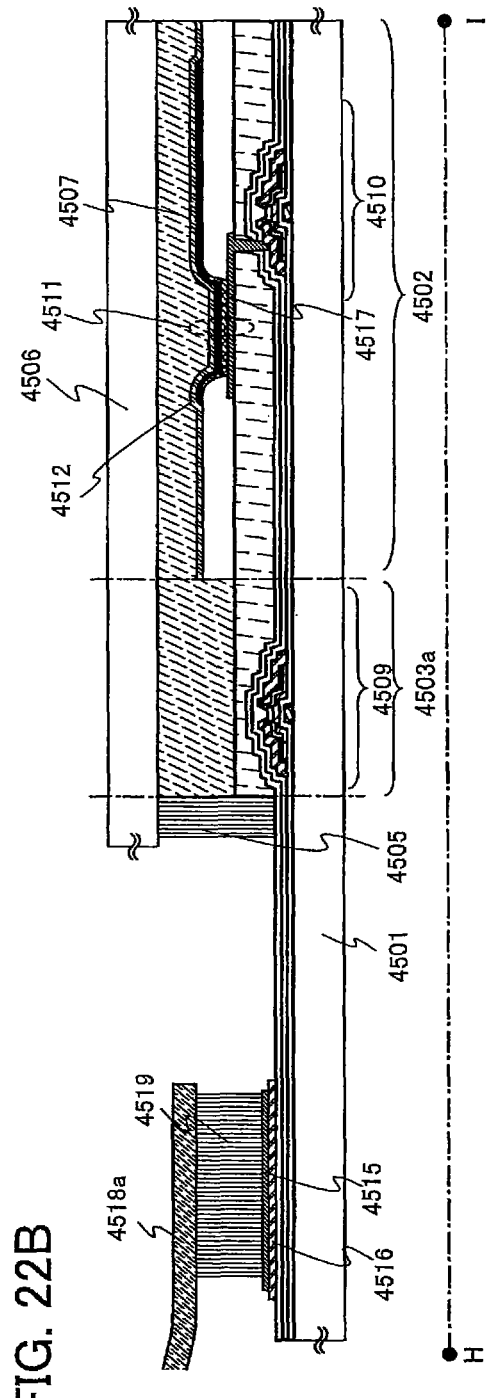

Next, the appearance and a cross section of a light-emitting display panel, which is one embodiment of the semiconductor device of the present invention, will be described with reference to FIGS. 22A and 22B. FIG. 22A is a top view of a panel in which a highly reliable thin film transistor having an IGZO semiconductor layer and a buffer layer including metal oxide and a light-emitting element are sealed between a first substrate and a second substrate with a sealant. FIG. 22B is a cross-sectional view taken along line H-I of FIG. 22A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 22B.

Each of the thin film transistors 4509 and 4510 corresponds to a thin film transistor having an IGZO semiconductor layer and a buffer layer including metal oxide, and any of the thin film transistors described in Embodiments 1 to 5 can be applied thereto. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is not limited to that described in this embodiment. The structure of the light-emitting element 4511 can be changed as appropriate depending on the direction in which light is extracted from the light-emitting element 4511, or the like.

In addition, a variety of signals and a potential are supplied to the signal line driver circuits 4503a and 4503b, the scan line driver circuits 4504a and 4504b, or the pixel portion 4502 from FPCs 4518a and 4518b.

In this embodiment, a wiring 4516 is formed using the same material as that of the source electrode layer or the drain electrode layer. The wiring 4516 is connected to the pixel portion 4502, the signal line driver circuits 4503a and 4503b, or the scan line driver circuits 4504a and 4504b through a contact hole (not illustrated) provided in an insulating film that covers the thin film transistors 4509 and 4510. In addition, a connection terminal 4515 is formed over the wiring 4516 that is provided over an edge portion of the first substrate 4501, using the same material as that of the first electrode layer 4517.

The connection terminal 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

As the signal line driver circuits 4503a and 4503b and the scan line driver circuits 4504a and 4504b, driver circuits formed using a single crystal semiconductor film or polycrystalline semiconductor film over a substrate separately prepared may be mounted. In addition, only the signal line driver circuits or part thereof, or the scan line driver circuits or part thereof may be separately formed and mounted. This embodiment is not limited to the structure illustrated in FIGS. 22A and 22B.

Figure 17B:
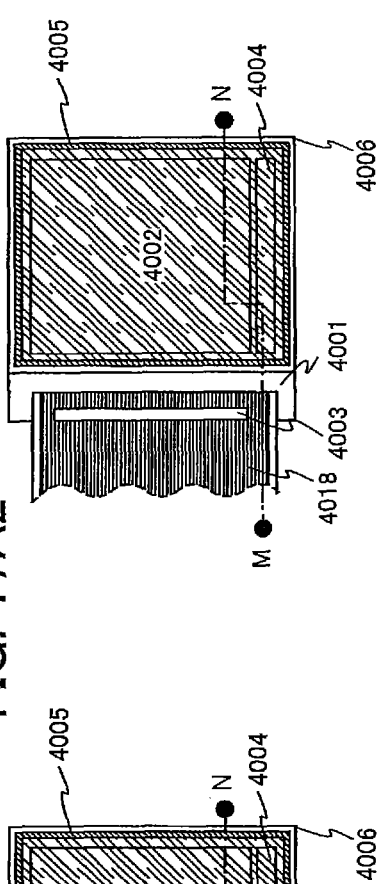
Figure 17B:
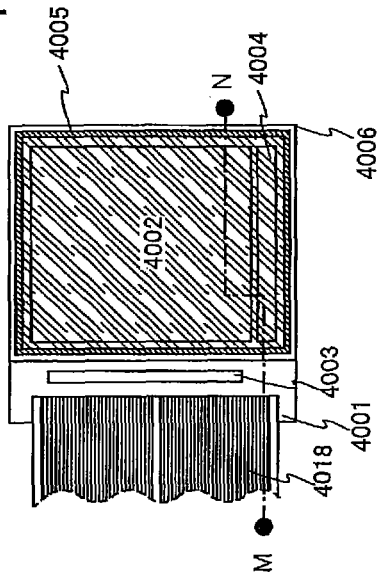
Figure 17B:
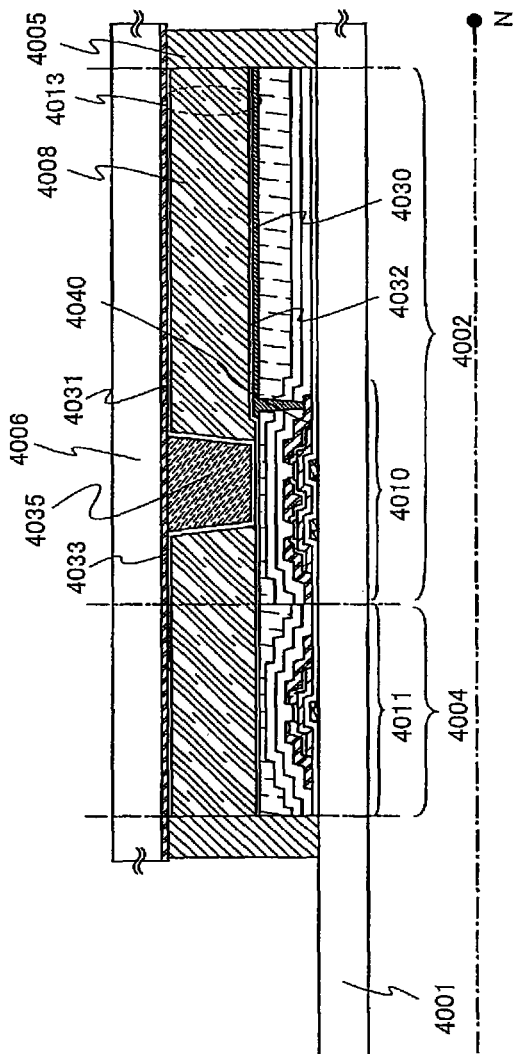

Next, the appearance and a cross section of a liquid crystal display panel, which is one embodiment of the semiconductor device of the present invention, will be described with reference to FIGS. 17A1, 17A2 and 17B. FIGS. 17A1 and 17A2 are a top view of a panel in which highly reliable thin film transistors 4010 and 4011 each having an IGZO semiconductor layer and a buffer layer including metal oxide, and a liquid crystal element 4013 are sealed between a first substrate 4001 and a second substrate 4006 with a sealant 4005. FIG. 17B is a cross-sectional view taken along line M-N of FIGS. 17A1 and 17A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with liquid crystal 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 17A1 illustrates an example of mounting the signal line driver circuit 4003 by a COG method, and FIG. 17A2 illustrates an example of mounting the signal line driver circuit 4003 by a TAB method.

The pixel portion 4002 and the scan line driver circuit 4004 provided over the first substrate 4001 include a plurality of thin film transistors. FIG. 17B illustrates the thin film transistor 4010 included in the pixel portion 4002 and the thin film transistor 4011 included in the scan line driver circuit 4004.

Each of the thin film transistors 4010 and 4011 corresponds to a thin film transistor having an IGZO semiconductor layer and a buffer layer including metal oxide, and any of the thin film transistors described in Embodiments 1 to 5 can be employed as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and sandwich the liquid crystal 4008 with the insulating layers 4032 and 4033 interposed between the pixel electrode layer 4030 and the counter electrode layer 4031.

Note that the first substrate 4001 and the second substrate 4006 can be formed by using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used.

Further, a variety of signals and a potential are supplied to the signal line driver circuit 4003 which is formed separately, the scan line driver circuit 4004, or the pixel portion 4002 from an FPC 4018.

In this embodiment, a connection terminal 4015 is formed using the same conductive film as that of the pixel electrode layer 4030 included in the liquid crystal element 4013, and a wiring 4016 is formed using the same conductive film as that of gate electrode layers of the thin film transistors 4010 and 4011.

The connection terminal 4015 is electrically connected to a terminal included in the FPC 4018 through an anisotropic conductive film 4019.

Note that FIGS. 17A1, 17A2 and 17B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 18:
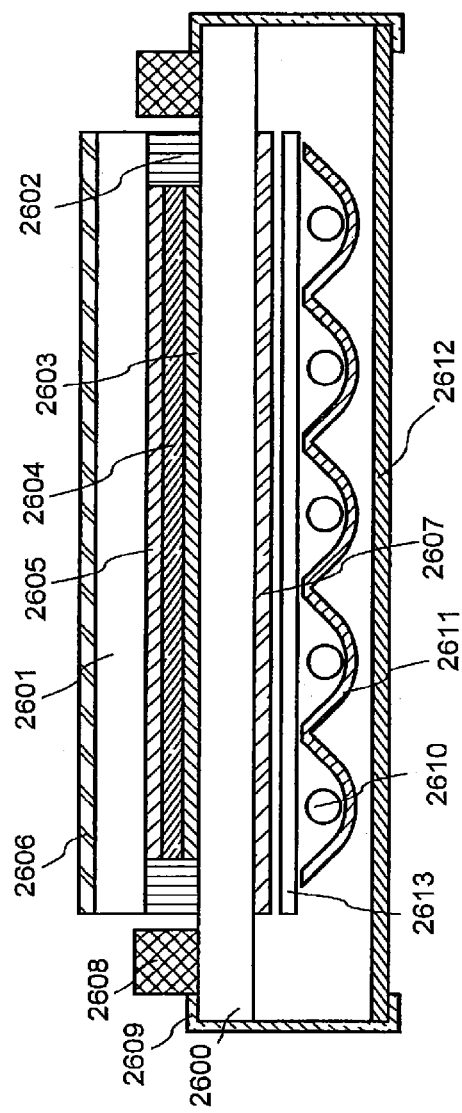
FIG. 18 is a view illustrating a liquid crystal display device to which an embodiment of the present invention is applied.

FIG. 18 illustrates an example in which a liquid crystal display module is formed as a semiconductor device by using a TFT substrate 2600 manufactured according to an embodiment of the present invention.

FIG. 18 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through this process, a highly reliable display panel as a semiconductor device can be manufactured.

This embodiment can be combined with the structure described in other embodiments, as appropriate.

Embodiment 12

A semiconductor device according to an embodiment of the present invention can be applied to a variety of electronic appliances (including an amusement machine). Examples of electronic appliances are a television set (also referred to as a television or a television receiver), a monitor of a computer or the like, electronic paper, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like. In particular, a liquid crystal display device, a light-emitting device, an electrophoretic display device, or the like to which a thin film transistor according to an embodiment of the present invention is applied as described in Embodiments 8 to 11 can be used for a display portion of an electronic appliance. Specific examples will be described below.

A semiconductor device according to an embodiment of the present invention can be applied to electronic paper as described in Embodiment 9. Electronic paper can be used for electronic appliances of a variety of fields as long as they can display data. For example, electronic paper can be applied to an electronic book (e-book), a poster, a transportation advertisement in a vehicle such as a train, displays of various cards such as a credit card, and the like. Examples of the electronic appliances are illustrated in FIGS. 24A and 24B and FIG. 25.

Figure 24A:
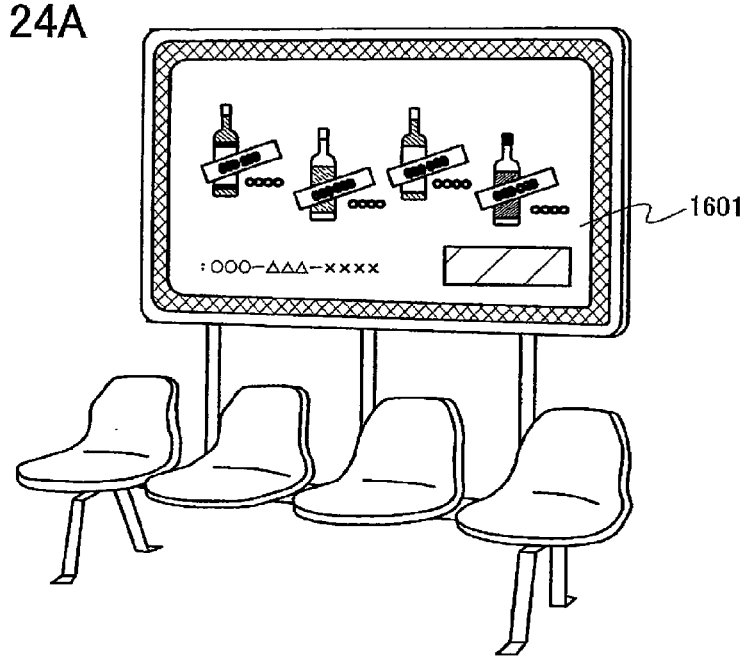
FIGS. 24A and 24B are views each illustrating an electronic appliance to which an embodiment of the present invention is applied.

FIG. 24A illustrates a poster 1601 formed using electronic paper. In the case where an advertising medium is printed paper, the advertisement is replaced by manpower; however, by using electronic paper to which a semiconductor device according to an embodiment of the present invention is applied, the advertising display can be changed in a short time. Further, since a thin film transistor having excellent electric characteristics is used, an image can be stably displayed without being distorted. Note that the poster may transmit and receive data wirelessly.

Figure 24B:
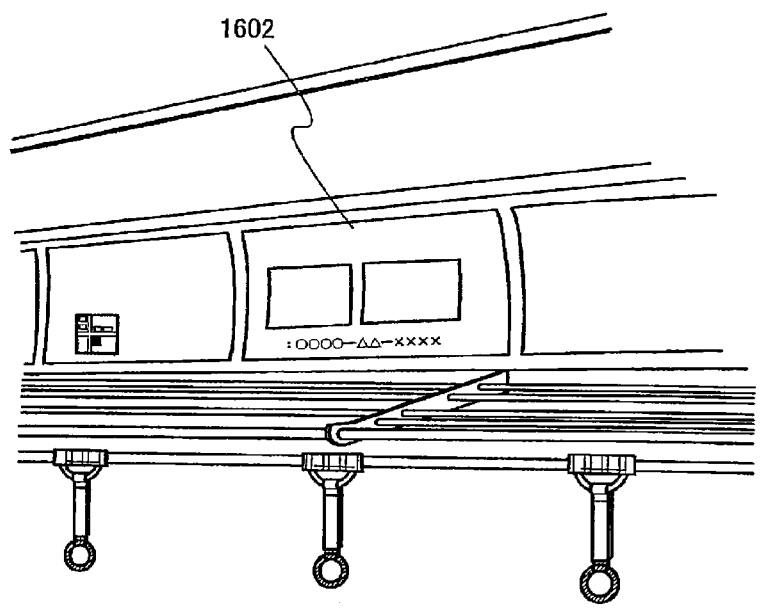

FIG. 24B illustrates an advertisement 1602 in a vehicle such as a train. In the case where an advertising medium is printed paper, the advertisement is replaced by manpower; however, by using electronic paper to which a semiconductor device according to an embodiment of the present invention is applied, the advertising display can be changed in a short time without a lot of manpower. Further, since a thin film transistor having excellent electric characteristics is used, an image can be stably displayed without being distorted. Note that the advertisement in a vehicle may transmit and receive data wirelessly.

Figure 25:
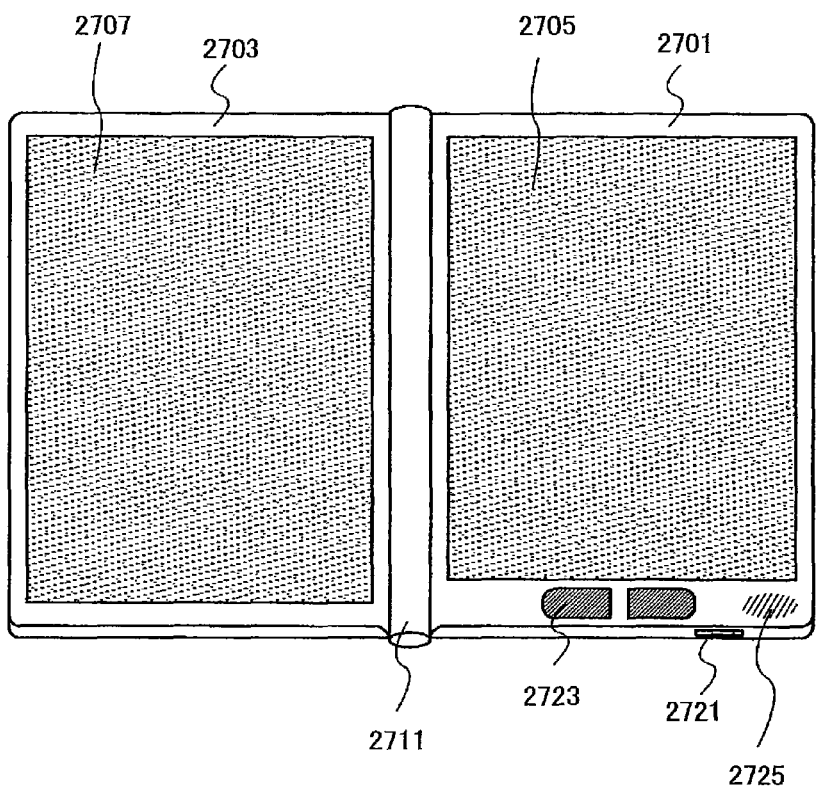
FIG. 25 is a view illustrating an electronic appliance to which an embodiment of the present invention is applied.

FIG. 25 illustrates an example of an electronic book 2700. For example, the electronic book 2700 includes two housings, a housing 2701 and a housing 2703. The housing 2701 and the housing 2703 are combined with a hinge 2711 so that the electronic book 2700 can be opened and closed with the hinge 2711 as an axis. With such a structure, the electronic book 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 25) can display text and a display portion on the left side (the display portion 2707 in FIG. 25) can display graphics.

FIG. 25 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the surface of the housing, on which the display portion is provided. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book 2700 may have a function of an electronic dictionary.

The electronic book 2700 may transmit and receive data wirelessly. The structure may be employed in which a desired book data or the like is purchased and downloaded from an electronic book server wirelessly.

Figure 26A:
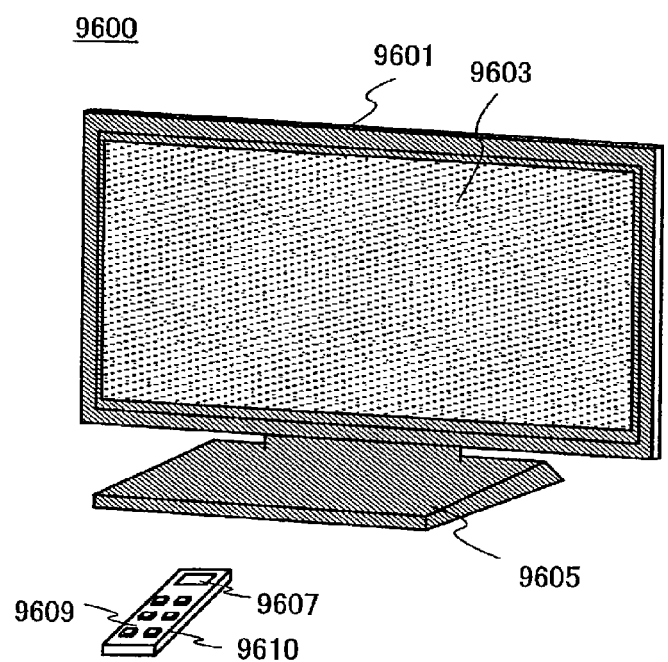
FIGS. 26A and 26B are views each illustrating an electronic appliance to which an embodiment of the present invention is applied.

FIG. 26A illustrates an example of a television set 9600. In the television set 9600, a display portion 9603 is incorporated in a housing 9601. The display portion 9603 can display an image. Further, the housing 9601 is supported by a stand 9605 here. Any of the display devices described in Embodiments 8 to 11 can be applied to the display portion 9603.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 26B:
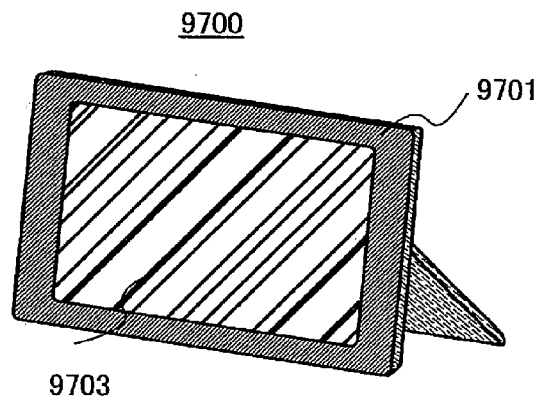

FIG. 26B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may transmit and receive data wirelessly. The structure may be employed in which desired image data is transferred wirelessly to be displayed.

Figure 27:
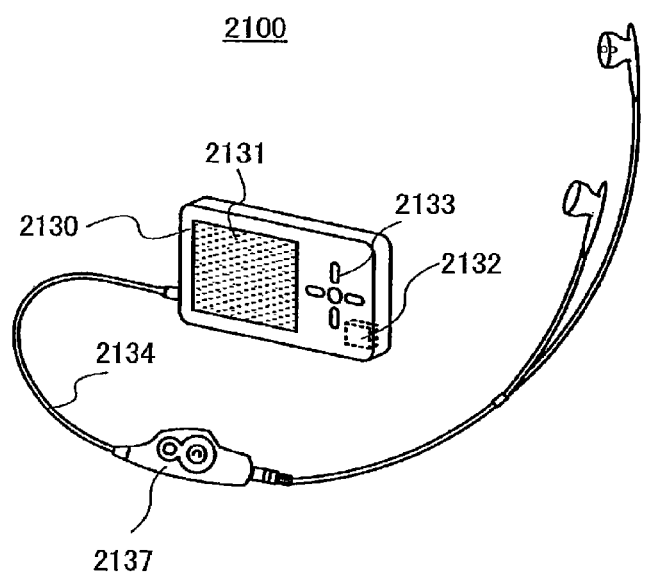
FIG. 27 is a view illustrating an electronic appliance to which an embodiment of the present invention is applied.

FIG. 27 illustrates an example of a digital player 2100 that is a portable audio device. The digital player 2100 includes a housing 2130, a display portion 2131, a memory portion 2132, an operation portion 2133, earphones 2134, a control portion 2137, and the like. Note that headphones or wireless earphones may be used instead of the earphones 2134. Any of the display devices described in Embodiments 8 to 11 can be applied to the display portion 2131.

Further, images and sounds (music) can be recorded and reproduced with the use of the memory portion 2132 by operating the operation portion 2133. Note that power consumption of the display portion 2131 can be suppressed through display of white text on black background. Note that a memory provided in the memory portion 2132 may be removable.

Figure 28:
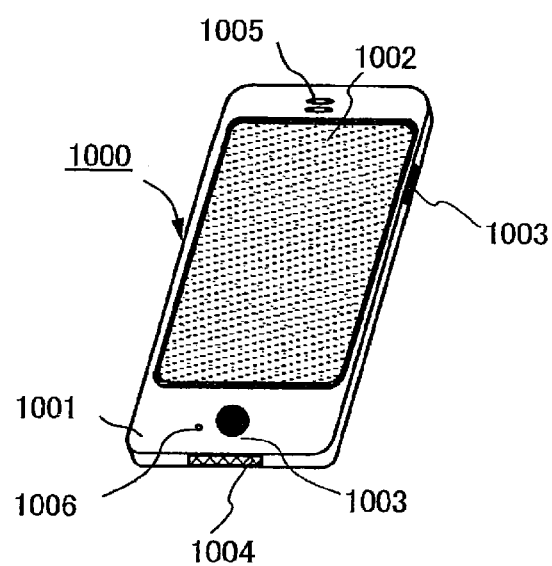
FIG. 28 is a view illustrating an electronic appliance to which an embodiment of the present invention is applied.

FIG. 28 illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like. Any of the display devices described in Embodiments 8 to 11 can be applied to the display portion 1002.

When the display portion 1002 of the mobile phone 1000 illustrated in FIG. 28 is touched with a finger or the like, data can be input into the mobile phone 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display on the screen of the display portion 1002 can be automatically switched by determining the direction of the mobile phone 1000 (whether the mobile phone 1000 is placed horizontally or vertically for a landscape mode or a portrait mode).

The screen mode is switched by touching the display portion 1002 or operating the operation buttons 1003 of the housing 1001. Alternatively, the screen mode may be switched depending on the kind of the image displayed on the display portion 1002. For example, when a signal of an image displayed on the display portion is of moving image data, the screen mode is switched to the display mode. When the signal is of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

This embodiment can be implemented in combination with any of the structures described in the other embodiments as appropriate.

This application is based on Japanese Patent Application serial no. 2008-197143 filed with Japan Patent Office on Jul. 31, 2008, the entire contents of which are hereby incorporated by reference.

What is claimed is:

1. A method for manufacturing a semiconductor device comprising:
   forming a gate electrode over a substrate;
   forming a gate insulating film comprising silicon oxide over the gate electrode;
   forming an oxide semiconductor layer containing indium and zinc over the gate insulating film;
   forming a second insulating film comprising silicon oxide over the oxide semiconductor layer;
   forming a channel protective layer over a channel formation region of the oxide semiconductor layer by selectively etching the second insulating film;
   forming a film having n-type conductivity over the oxide semiconductor layer; and
   forming a conductive film over the film having n-type conductivity,
   wherein each of the gate insulating film, the oxide semiconductor layer and the second insulating film is formed by sputtering in an atmosphere containing oxygen at 90% or more.

2. The method for manufacturing a semiconductor device according to claim 1, wherein the channel protective layer serves as an etching stopper.

3. The method for manufacturing a semiconductor device according to claim 1, wherein the gate electrode comprises a stack of aluminum and a refractory metal, the refractory metal is selected from the group consisting of titanium, molybdenum and chromium.

4. The method for manufacturing a semiconductor device according to claim 1, wherein the film having n-type conductivity comprises a material selected from the group consisting of a metal oxide having n-type conductivity and an oxide semiconductor having n-type conductivity and containing indium, gallium, and zinc.

5. The method for manufacturing a semiconductor device according to claim 1, wherein the film having n-type conductivity comprises a metal oxide having n-type conductivity selected from the group consisting of titanium oxide, molybdenum oxide, zinc oxide, indium oxide, tungsten oxide, magnesium oxide, calcium oxide and tin oxide.

6. The method for manufacturing a semiconductor device according to claim 1, wherein the film having n-type conductivity comprises an oxide semiconductor containing indium, gallium, and zinc and including an impurity element imparting n-type conductivity selected from the group consisting of aluminum, and tin.

7. The method for manufacturing a semiconductor device according to claim 1, wherein at least one of a source region and a drain region is provided in the film having n-type conductivity.

8. The method for manufacturing a semiconductor device according to claim 1, wherein the semiconductor device is selected from the group consisting of an electronic book reader, a television set, a digital photo frame and a mobile phone.

9. The method for manufacturing a semiconductor device according to claim 1, wherein the gate insulating film, the oxide semiconductor layer and the second insulating film are successively formed without exposing the substrate to the air.

10. The method for manufacturing a semiconductor device according to claim 1, wherein the oxide semiconductor layer includes gallium.

11. A method for manufacturing a semiconductor device comprising:
    forming a gate electrode over a substrate;
    forming a gate insulating film over the gate electrode;
    forming an oxide semiconductor layer containing indium and zinc over the gate insulating film;
    forming a second insulating film comprising silicon oxide over the oxide semiconductor layer;
    forming a channel protective layer over a channel formation region of the oxide semiconductor layer by selectively etching the second insulating film; and
    forming a conductive film over the oxide semiconductor layer,
    wherein each of the gate insulating film, the oxide semiconductor layer and the second insulating film is formed by sputtering in an atmosphere containing oxygen at 90% or more.

12. The method for manufacturing a semiconductor device according to claim 11, wherein the gate insulating film, the oxide semiconductor layer and the second insulating film are successively formed without exposing the substrate to the air.

13. The method for manufacturing a semiconductor device according to claim 11, wherein the oxide semiconductor layer includes gallium.

14. The method for manufacturing a semiconductor device according to claim 11, further comprising the step of:
    forming a film having n-type conductivity over the oxide semiconductor layer prior to the formation of the conductive film.

15. The method for manufacturing a semiconductor device according to claim 1, further comprising the step of performing a plasma treatment to the oxide semiconductor layer in an oxygen containing atmosphere.

16. The method for manufacturing a semiconductor device according to claim 11, further comprising the step of performing a plasma treatment to the oxide semiconductor layer in an oxygen containing atmosphere.

17. The method for manufacturing a semiconductor device according to claim 15, wherein the oxygen containing atmosphere includes a gas selected from the group consisting of $O_2$ and $N_2O$.

18. The method for manufacturing a semiconductor device according to claim 16, wherein the oxygen containing atmosphere includes a gas selected from the group consisting of $O_2$ and $N_2O$.

19. The method for manufacturing a semiconductor device according to claim 1, wherein the gate insulating film, the oxide semiconductor layer and the second insulating film are successively formed.

20. The method for manufacturing a semiconductor device according to claim 11, wherein the gate insulating film, the oxide semiconductor layer and the second insulating film are successively formed.

21. The method for manufacturing a semiconductor device according to claim 11, wherein the gate insulating film comprises silicon oxide.

22. A method for manufacturing a semiconductor device comprising:
    forming a gate electrode over a substrate;
    forming a gate insulating film over the gate electrode;
    forming an oxide semiconductor layer containing indium and zinc over the gate insulating film;
    forming a second insulating film comprising silicon oxide over the oxide semiconductor layer;
    forming a channel protective layer over a channel formation region of the oxide semiconductor layer by selectively etching the second insulating film; and
    forming a conductive film over the oxide semiconductor layer,
    wherein the oxide semiconductor layer is formed by sputtering in an atmosphere containing oxygen at 90% or more.

23. The method for manufacturing a semiconductor device according to claim 22, wherein the oxide semiconductor layer includes gallium.

24. The method for manufacturing a semiconductor device according to claim 22, further comprising the step of:
    forming a film having n-type conductivity over the oxide semiconductor layer prior to the formation of the conductive film.

25. The method for manufacturing a semiconductor device according to claim 22, further comprising the step of performing a plasma treatment to the oxide semiconductor layer in an oxygen containing atmosphere.

26. The method for manufacturing a semiconductor device according to claim 25, wherein the oxygen containing atmosphere includes a gas selected from the group consisting of $O_2$ and $N_2O$.

27. The method for manufacturing a semiconductor device according to claim 22, wherein the gate insulating film, the oxide semiconductor layer and the second insulating film are successively formed.

28. The method for manufacturing a semiconductor device according to claim 22, wherein the gate insulating film comprises silicon oxide.

* * * * *